United States Patent
Hong

(10) Patent No.: US 10,839,925 B2
(45) Date of Patent: *Nov. 17, 2020

(54) SEMICONDUCTOR MEMORY DEVICE AND METHOD OF OPERATING THE SAME

(71) Applicant: SK hynix Inc., Icheon-si (KR)

(72) Inventor: Ji Man Hong, Seongnam-si (KR)

(73) Assignee: SK hynix Inc., Icheon (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/259,967

(22) Filed: Jan. 28, 2019

(65) Prior Publication Data

US 2019/0156904 A1 May 23, 2019

Related U.S. Application Data

(63) Continuation-in-part of application No. 15/867,103, filed on Jan. 10, 2018, now Pat. No. 10,192,628.

(30) Foreign Application Priority Data

Sep. 11, 2017 (KR) ........................ 10-2017-0115998

(51) Int. Cl.
*G11C 16/34* (2006.01)
*G11C 11/56* (2006.01)
*G11C 7/10* (2006.01)
*G06F 3/06* (2006.01)
*G11C 16/08* (2006.01)
(Continued)

(52) U.S. Cl.
CPC ........ *G11C 16/3459* (2013.01); *G06F 3/0688* (2013.01); *G11C 7/109* (2013.01); *G11C 7/1063* (2013.01); *G11C 11/5628* (2013.01); *G11C 11/5642* (2013.01); *G11C 16/08* (2013.01); *G11C 16/10* (2013.01); *G11C 16/16* (2013.01);
(Continued)

(58) Field of Classification Search
CPC ..... G11C 16/3459; G11C 7/109; G11C 16/28; G11C 16/24; G11C 16/16; G11C 7/1063; G11C 11/5642; G11C 11/5628; G11C 16/08

See application file for complete search history.

(56) References Cited

U.S. PATENT DOCUMENTS

2008/0084739 A1 4/2008 Chae et al.
2008/0089123 A1* 4/2008 Chae .................. G11C 11/5628
365/185.03
(Continued)

FOREIGN PATENT DOCUMENTS

KR 1020120066347 A 6/2012
KR 1020120088442 A 8/2012

*Primary Examiner* — Mohammed A Bashar
(74) *Attorney, Agent, or Firm* — William Park & Associates Ltd.

(57) ABSTRACT

Provided herein may be a method of operating a semiconductor memory device. The method of operating a semiconductor memory device may include programming selected memory cells with first page data, and programming the selected memory cells with second page data and programming a flag cell with flag data according to a foggy-fine programming scheme. The flag data may indicate whether data programmed according to the program operation is the first page data or the second page data. An operation of programming the flag cell with the flag data may be initiated after foggy programming of the second page data is completed.

8 Claims, 21 Drawing Sheets

(51) Int. Cl.
*G11C 16/16* (2006.01)
*G11C 16/24* (2006.01)
*G11C 16/28* (2006.01)
*G11C 16/10* (2006.01)

(52) U.S. Cl.
CPC .............. *G11C 16/24* (2013.01); *G11C 16/28* (2013.01); *G11C 2211/5646* (2013.01)

(56) References Cited

U.S. PATENT DOCUMENTS

| | | |
|---|---|---|
| 2008/0094893 A1 | 4/2008 | Choi |
| 2011/0157999 A1 | 6/2011 | Yoon |
| 2012/0008402 A1* | 1/2012 | Park .................. G11C 16/0483 365/185.18 |
| 2012/0147669 A1 | 6/2012 | Byeon |

* cited by examiner

SEMICONDUCTOR MEMORY DEVICE AND METHOD OF OPERATING THE SAME

CROSS-REFERENCE TO RELATED APPLICATION

The present application is a continuation-in-part application for U.S. patent application Ser. No. 15/867,103, filed on Jan. 10, 2018, claims priority under 35 U.S.C. § 119(a) to Korean patent application number 10-2017-0115998 filed on Sep. 11, 2017, in the Korean Intellectual Property Office, the entire disclosure of which is incorporated herein by reference.

BACKGROUND

1. Technical Field

Various embodiments of the present disclosure generally relate to an electronic device, and more particularly, to a semiconductor memory device and a method of operating the semiconductor memory device.

2. Related Art

A memory device may have a two-dimensional (2D) structure in which strings are horizontally arranged on a semiconductor substrate, or a three-dimensional (3D) structure in which strings are vertically stacked on a semiconductor substrate. The 3D memory device is a memory device which is devised to overcome a limitation in the degree of integration of the 2D memory device and may include a plurality of memory cells which are vertically stacked on a semiconductor substrate.

SUMMARY

An embodiment of the present disclosure may provide for a method of operating a semiconductor memory device. The method may include programming selected memory cells with first page data, and programming the selected memory cells with second page data and programming a flag cell with flag data according to a foggy-fine programming scheme. The flag data indicates whether data programmed according to the program operation may be the first page data or the second page data. An operation of programming the flag cell with the flag data may be initiated after foggy programming of the second page data is completed.

The programming of the selected memory cells with the second page data and the programming of the flag cell with the flag data according to the foggy-fine programming scheme may include a foggy programming operation of programming memory cells except the flag cell by using first verify voltages, and a fine programming operation of programming memory cells including the flag cell by using second verify voltages greater than the first verify voltages.

In the foggy programming operation, program pulses may be generated using a first step voltage, and in the fine programming operation, program pulses may be generated using a second step voltage smaller than the first step voltage.

In the foggy programming operation, a program prohibition voltage may be applied to a bit line coupled to the flag cell.

In the fine programming operation, a program permission voltage may be applied to a bit line coupled to the flag cell.

An embodiment of the present disclosure may provide for a semiconductor memory device. The semiconductor memory device may include a memory cell array including a plurality of memory cells, a peripheral circuit configured to perform a program operation of programming data in memory cells coupled to a selected word line, among the plurality of memory cells, and a control logic configured to control the peripheral circuit such that, during the program operation, a first program loop for storing first page data and a second program loop for storing second page data according to a foggy-fine programming scheme. The control logic may be configured to control the peripheral circuit such that, during execution of the second program loop, flag data is programmed in a flag cell, among memory cells coupled to the selected word line, after foggy programming of the second page data is completed.

During the execution of the second program loop, the control logic may be configured to perform a foggy programming of memory cells except for the flag cell by using first verify voltages, and perform a fine programming of memory cells including the flag cell by using second verify voltages greater than the first verify voltages.

During the foggy programming of the memory cells except for the flag cell, the control logic may be configured to control the peripheral circuit to apply a program prohibition voltage to a bit line coupled to the flag cell.

During the fine programming of the memory cells including the flag cell, the control logic may be configured to control the peripheral circuit to apply a program permission voltage to a bit line coupled to the flag cell.

The flag data may indicate that data programmed according to the program operation is the second page data.

An embodiment of the present disclosure may provide for a method of operating a semiconductor memory device. The method may include programming selected memory cells with first page data, and performing a program operation of flag data and second page data on the basis of an operation of verifying at least one program state, among a plurality of program states. The plurality of program states may include a first program state to a $(2^N-1)$-th program state, where N is a natural number of 2 or more. The flag data may indicate whether data programmed according to the program operation is the first page data or the second page data. During the program operation of the second page data and the flag data, the program operation of the flag data may be initiated after an operation of verifying at least one of the first program state and the $(2^N-1)$-th program state.

The performing of the program operation of the flag data and the second page data may include a first program operation of programming memory cells except for a flag cell in which the flag data is to be stored, and a second program operation of programming memory cells including the flag cell.

The first program operation may be terminated based on the operation of verifying the at least one program state.

The first program operation may be terminated when the operation of verifying at least one of the plurality of program states is completed.

The first program operation may be terminated when an operation of verifying the first program state is completed.

The first program operation may be terminated when an operation of verifying the $(2^N-1)$-th program state is completed.

The first program operation may be configured to apply a program prohibition voltage to a bit line coupled to the flag cell.

The second program operation may be configured to apply a program permission voltage to a bit line coupled to the flag cell.

An embodiment of the present disclosure may provide for a semiconductor memory device. The semiconductor memory device may include a memory cell array including a plurality of memory cells, a peripheral circuit configured to program data in memory cells coupled to a selected word line, among the plurality of memory cells, and a control logic configured to control the peripheral circuit such that, during the program operation, a first program loop for storing first page data and a second program loop for storing second page data are executed. As the second program loop is executed, threshold voltages of the memory cells coupled to the selected word line may be classified into an erase state and first to $(2^N-1)$-th program state. The control logic may be configured to control the peripheral circuit such that, during execution of the second program loop, flag data indicating data programmed according to the program operation is the second page data after an operation of verifying at least one of the first to $(2^N-1)$-th program state, where N is a natural number of 2 or more.

The control logic may be configured to program the flag data after an operation of verifying the first program state is performed.

The control logic may be configured to control the peripheral circuit such that, in a first program loop after an operation of verifying the first program state is performed, a program prohibition voltage is applied to a bit line coupled to a flag cell in which the flag data is to be stored.

The control logic may be configured to control the peripheral circuit such that, in a first program loop after an operation of verifying the first program state is performed, a program permission voltage is applied to a bit line coupled to a flag cell in which the flag data is to be stored.

The control logic may be configured to control the peripheral circuit such that the flag data is programmed after an operation of verifying the (2N−1)-th program state is performed.

The control logic may be configured to control the peripheral circuit, in a second program loop before the operation of verifying the (2N−1)-th program state is performed, a program prohibition voltage is applied to a bit line coupled to a flag cell in which the flag data is to be stored.

The control logic may be configured to control the peripheral circuit such that, in a second program loop before the operation of verifying the (2N−1)-th program state is performed, a program permission voltage is applied to a bit line coupled to a flag cell in which the flag data is to be stored.

DETAILED DESCRIPTION

Figure 1:
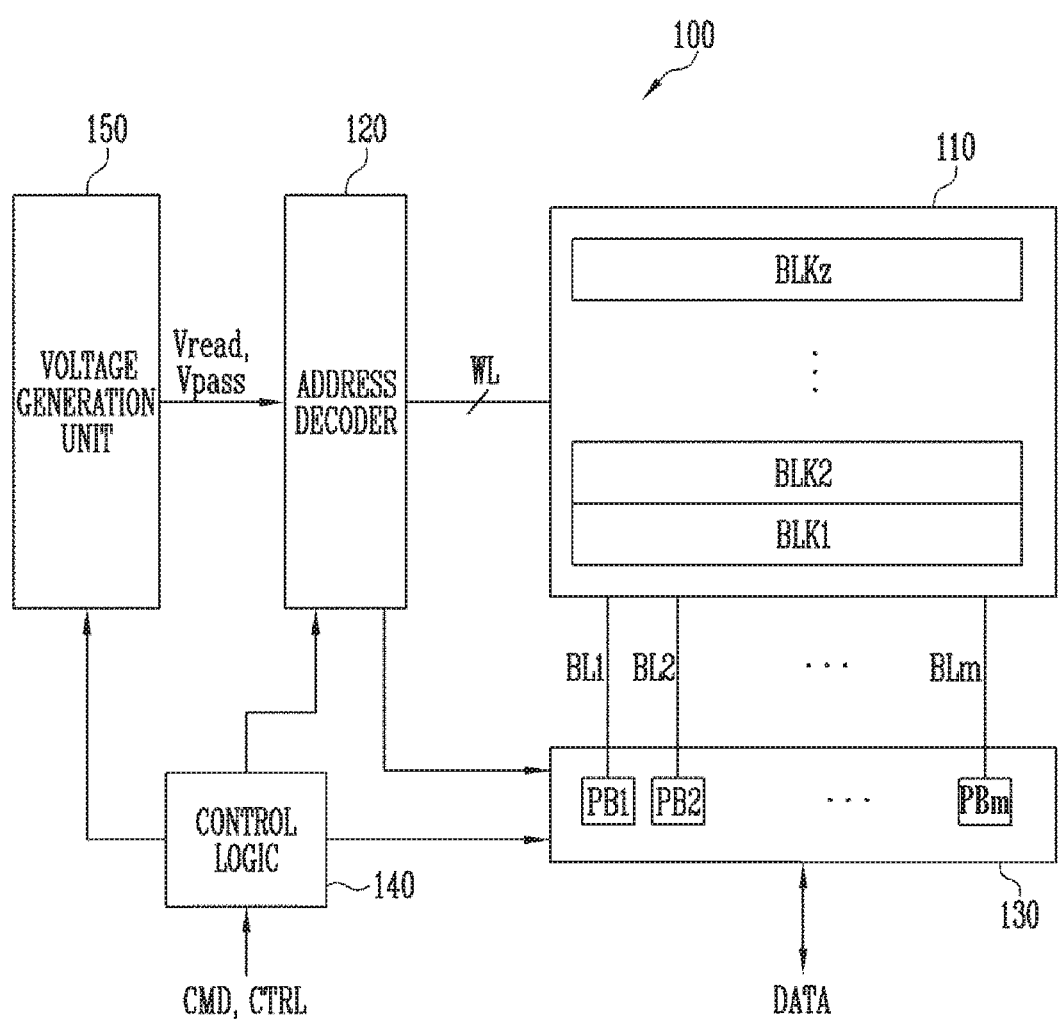
FIG. 1 is a block diagram illustrating a semiconductor memory device according to an embodiment of the present disclosure.

Advantages and features of the present disclosure, and methods for achieving the same will be cleared with reference to exemplary embodiments described later in detail together with the accompanying drawings. Accordingly, the present disclosure is not limited to the following embodiments but embodied in other forms. Rather, these embodiments are provided so that the present disclosure will be thorough and complete, and will fully convey the technical spirit of the disclosure to those skilled in the art.

It will be understood that when an element is referred to as being "coupled" or "connected" to another element, it can be directly coupled or connected to the other element or intervening elements may be present therebetween. In the specification, when an element is referred to as "comprising" or "including" a component, it does not preclude another component but may further include other components unless the context clearly indicates otherwise.

Hereinafter, embodiments in accordance with the present disclosure will be described with reference to the accompanying drawings. Reference now should be made to the drawings, in which the same reference numerals are used throughout the different drawings to designate the same or similar components. Details of well-known configurations and functions may be omitted to avoid unnecessarily obscuring the gist of the present disclosure.

Various embodiments of the present disclosure may be directed to a semiconductor memory device, which may have improved operation reliability.

Various embodiments of the present disclosure may be directed to a method of operating the semiconductor memory device, which may improve reliability.

FIG. 1 is a block diagram illustrating a semiconductor memory device according to an embodiment of the present disclosure.

Referring to FIG. 1, a semiconductor memory device 100 includes a memory cell array 110, an address decoder 120, a read and write circuit 130, a control logic 140, and a voltage generation unit 150.

The memory cell array 110 includes a plurality of memory blocks BLK1 to BLKz. The memory blocks BLK1 to BLKz may be coupled to the address decoder 120 through word lines WL. The memory blocks BLK1 to BLKz are coupled to the read and write circuit 130 through bit lines BL1 to BLm. Each of the memory blocks BLK1 to BLKz includes a plurality of memory cells. In an embodiment, the plurality of memory cells may be nonvolatile memory cells, and may be implemented as nonvolatile memory cells having a vertical channel structure. The memory cell array 110 may be implemented as a memory cell array having a two-dimensional (2D) structure. In an embodiment, the memory cell array 110 may be implemented as a memory cell array having a three-dimensional (3D) structure. Each of the memory cells included in the memory cell array may store at least one bit of data. In an embodiment, each of the memory cells included in the memory cell array 110 may be a single-level cell (SLC), which stores 1-bit data. In an embodiment, each of the memory cells included in the memory cell array 110 may be a multi-level cell (MLC), which stores 2-bit data. In an embodiment, each of the memory cells included in the memory cell array 110 may be a triple-level cell, which stores 3-bit data. In an embodiment, each of the memory cells included in the memory cell array 110 may be a quad-level cell, which stores 4-bit data. In various embodiments, the memory cell array 110 may include a plurality of memory cells, each of which stores 5 or more bits of data.

The address decoder 120, the read and write circuit 130, the control logic 140, and the voltage generation unit 150 are operated as a peripheral circuit for driving the memory cell array 110. The address decoder 120 is coupled to the memory cell array 110 through the word lines WL. The address decoder 120 may be operated under the control of the control logic 140. The address decoder 120 may receive addresses through an input/output buffer (not illustrated) provided in the semiconductor memory device 100.

The address decoder 120 may decode a block address, among the received addresses. The address decoder 120 selects at least one memory block based on the decoded block address. When a read voltage application operation is performed during a read operation, the address decoder 120 may apply a read voltage Vread, generated by the voltage generation unit 150, to a selected word line of a selected memory block, and may apply a pass voltage Vpass to remaining unselected word lines. During a program verify operation, the address decoder 120 may apply a verify voltage, generated by the voltage generation unit 150, to a selected word line of a selected memory block, and may apply the pass voltage Vpass to remaining unselected word lines.

The address decoder 120 may decode a column address, among the received addresses. The address decoder 120 may transmit the decoded column address to the read and write circuit 130.

The read and program operations of the semiconductor memory device 100 are each performed on a page basis. Addresses received at the request of read and program operations may include a block address, a row address and a column address. The address decoder 120 may select one memory block and one word line in accordance with the block address and the row address. The column address may be decoded by the address decoder 120, and may then be provided to the read and write circuit 130.

The address decoder 120 may include a block decoder, a row decoder, a column decoder, an address buffer, etc.

The read and write circuit 130 includes a plurality of page buffers PB1 to PBm. The read and write circuit 130 may be operated as a "read circuit" during a read operation of the memory cell array 110 and as a "write circuit" during a write operation thereof. The plurality of page buffers PB1 to PBm are coupled to the memory cell array 110 through the bit lines BL1 to BLm. During a read or program verify operation, in order to sense threshold voltages of the memory cells, the page buffers PB1 to PBm may continuously supply sensing current to the bit lines coupled to the memory cells while each of the page buffers PB1 to PBm senses, through a sensing node, a change in the amount of flowing current depending on the program state of a corresponding memory cell and latches it as sensing data. The read and write circuit 130 is operated in response to page buffer control signals outputted from the control logic 140.

During a read operation, the read and write circuit 130 may sense data stored in the memory cells and temporarily store read data, and may then output data DATA to the input/output buffer (not illustrated) of the semiconductor memory device 100. In an embodiment, the read and write circuit 130 may include a column select circuit or the like as well as the page buffers (or page resistors).

The control logic 140 is coupled to the address decoder 120, the read and write circuit 130, and the voltage generation unit 150. The control logic 140 may receive a command CMD and a control signal CTRL through the input/output buffer (not illustrated) of the semiconductor memory device 100. The control logic 140 may control the overall operation of the semiconductor memory device 100 in response to the control signal CTRL. The control logic 140 may output a control signal for controlling a precharge potential level at the sensing node of the plurality of page buffers PB1 to PBm. The control logic 140 may control the read and write circuit 130 to perform a read operation of the memory cell array 110.

The control logic 140 controls the peripheral circuit so that, during the program operation, a Least Signification Bit (LSB) program loop for storing LSB data and a Most Significant Bit (MSB) program loop for storing MSB data are executed. As the MSB program loop is executed, threshold voltages of memory cells coupled to the selected word line may be classified into an erase state and first to third program states. Further, the control logic 140 may control the peripheral circuit so that, during the execution of the MSB program loop, flag data indicating that data programmed according to the program operation is the MSB data is programmed after an operation of verifying at least one of the first to third program states has been performed.

In an embodiment, the control logic may control the peripheral circuit so that the flag data is programmed after the operation of verifying the first program state has been performed. Alternatively, in an embodiment, the control logic may control the peripheral circuit so that the flag data is programmed after the operation of verifying the third program state has been performed.

In another embodiment, the control logic 140 may use a foggy-fine programming scheme when the MSB program loop is executed. The peripheral circuit may be controlled to program flag data indicating data programmed according to the program operation is the MSB data after a foggy-fine programming procedure is completed.

The voltage generation unit 150 may generate a read voltage Vread and a pass voltage Vpass required for a read operation in response to a control signal outputted from the control logic 140. The voltage generation unit 150 may include a plurality of pumping capacitors for receiving an internal supply voltage to generate a plurality of voltages having various voltage levels, and may generate a plurality of voltages by selectively enabling the plurality of pumping capacitors under the control of the control logic 140. In an embodiment, for example, the control logic 140 may be implemented with software, hardware, or any combination thereof.

Figure 2:
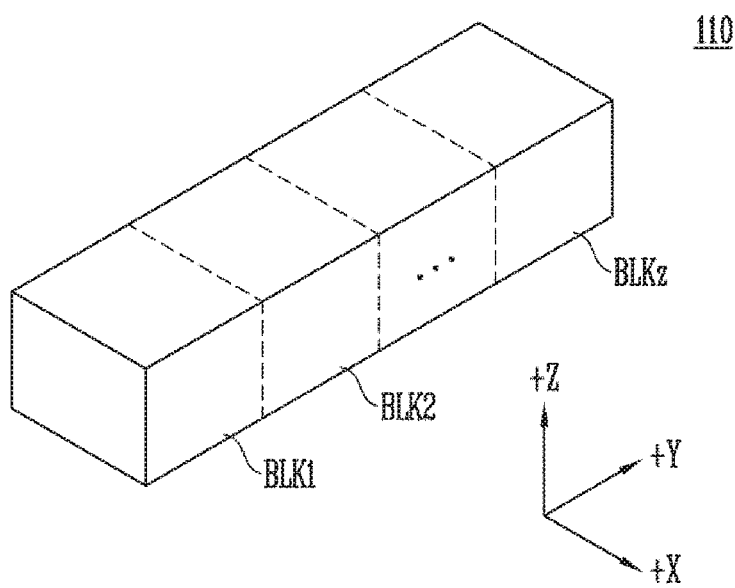
FIG. 2 is a diagram illustrating an embodiment of a memory cell array of FIG. 1.

FIG. 2 is a diagram illustrating an embodiment of the memory cell array of FIG. 1.

Referring to FIG. 2, a memory cell array 110 includes a plurality of memory blocks BLK1 to BLKz. Each of the memory blocks may have a three-dimensional (3D) structure. Each of the memory blocks may include a plurality of memory cells stacked on a substrate. The memory cells are arranged in +X, +Y, and +Z directions. The structure of each memory block will be described below with reference to FIGS. 3 and 4.

Figure 3:
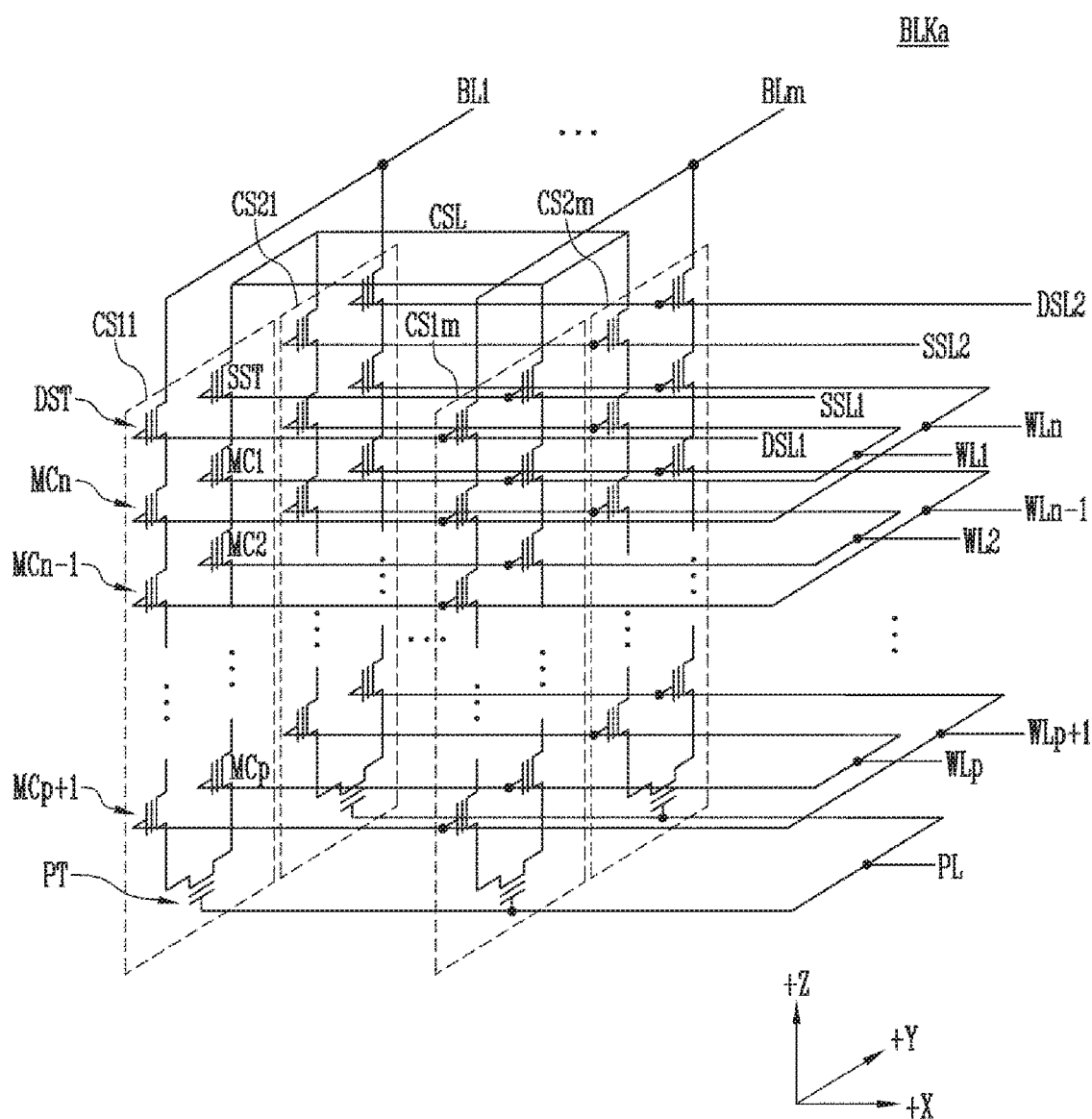
FIG. 3 is a circuit diagram illustrating any one memory block BLKa of memory blocks BLK1 to BLKz of FIG. 2.

FIG. 3 is a circuit diagram illustrating any one memory block BLKa of the memory blocks BLK1 to BLKz of FIG. 2.

Referring to FIG. 3, the memory block BLKa includes a plurality of cell strings CS11 to CS1*m* and CS21 to CS2*m*. In an embodiment, each of the cell strings CS11 to CS1*m* and CS21 to CS2*m* may be formed in a 'U' shape. In the memory block BLKa, m cell strings are arranged in a row direction (i.e. a positive (+) X direction). In FIG. 3, two cell strings are illustrated as being arranged in a column direction (i.e. a positive (+) Y direction). However, this illustration is made for convenience of description, and it will be understood that three or more cell strings may be arranged in the column direction.

Each of the plurality of cell strings CS11 to CS1*m* and CS21 to CS2*m* includes at least one source select transistor SST, first to n-th memory cells MC1 to MCn, a pipe transistor PT, and at least one drain select transistor DST.

The select transistors SST and DST and the memory cells MC1 to MCn may have similar structures, respectively. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST in each cell string is connected between the common source line CSL and memory cells MC1 to MCp.

In an embodiment, the source select transistors of cell strings arranged in the same row are coupled to a source select line extended in a row direction, and source select transistors of cell strings arranged in different rows are coupled to different source select lines. In FIG. 3, source select transistors of cell strings CS11 to CS1*m* in a first row are coupled to a first source select line SSL1. The source select transistors of cell strings CS21 to CS2*m* in a second row are coupled to a second source select line SSL2.

In an embodiment, source select transistors of the cell strings CS11 to CS1*m* and CS21 to CS2*m* may be coupled in common to a single source select line.

The first to n-th memory cells MC1 to MCn in each cell string are coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp are sequentially arranged in a direction opposite a positive (+) Z direction and are connected in series between the source select transistor SST and the pipe transistor PT. The p+1-th to n-th memory cells MCp+1 to MCn are sequentially arranged in the +Z direction and are connected in series between the pipe transistor PT and the drain select transistor DST. The first to p-th memory cells MC1 to MCp and the p+1-th to n-th memory cells MCp+1 to MCn are coupled to each other through the pipe transistor PT. The gates of the first to n-th memory cells MC1 to MCn in each cell string are coupled to first to n-th word lines WL1 to WLn, respectively.

The gate of the pipe transistor PT in each cell string is coupled to a pipeline PL.

The drain select transistor DST in each cell string is connected between the corresponding bit line and the memory cells MCp+1 to MCn. The cell strings in a row direction are coupled to drain select lines extended in the row direction. Drain select transistors of cell strings CS11 to CS1*m* in the first row are coupled to a first drain select line DSL1. Drain select transistors of cell strings CS21 to CS2*m* in a second row are coupled to a second drain select line DSL2.

Cell strings arranged in a column direction are coupled to bit lines extended in a column direction. In FIG. 3, cell strings CS11 and CS21 in a first column are coupled to a first bit line BL1. Cell strings CS1*m* and CS2*m* in an m-th column are coupled to an m-th bit line BLm.

The memory cells coupled to the same word line in cell strings arranged in a row direction constitute a single page. For example, memory cells coupled to the first word line WL1, among the cell strings CS11 to CS1*m* in the first row, constitute a single page. Memory cells coupled to the first word line WL1, among the cell strings CS21 to CS2*m* in the second row, constitute a single additional page. Cell strings arranged in the direction of a single row may be selected by selecting any one of the drain select lines DSL1 and DSL2. A single page may be selected from the selected cell strings by selecting any one of the word lines WL1 to WLn.

In an embodiment, instead of the first to m-th bit lines BL1 to BLm, even bit lines and odd bit lines may be provided. Even-numbered cell strings, among the cell strings CS11 to CS1m or CS21 to CS2m arranged in a row direction, may be coupled to respective even bit lines. Odd-numbered cell strings, among the cell strings CS11 to CS1m or CS21 to CS2m arranged in the row direction, may be coupled to respective odd bit lines.

In an embodiment, one or more of the first to n-th memory cells MC1 to MCn may be used as dummy memory cells. For example, the one or more dummy memory cells are provided to reduce an electric field between the source select transistor SST and the memory cells MC1 to MCp. Alternatively, the one or more dummy memory cells are provided to reduce an electric field between the drain select transistor DST and the memory cells MCp+1 to MCn. As the number of dummy memory cells that are provided is increased, the reliability of operation of the memory block BLKa may be improved, whereas the size of the memory block BLKa may be increased. As the number of dummy memory cells that are provided is decreased, the size of the memory block BLKa may be decreased, whereas the reliability of operation of the memory block BLKa may be deteriorated.

In order to efficiently control the one or more dummy memory cells, respective dummy memory cells may have required threshold voltages. Before or after an erase operation on the memory block BLKa is performed, program operations may be performed on all or some of the dummy memory cells. When the erase operation is performed after the program operations have been performed, the respective dummy memory cells may have required threshold voltages by controlling voltages to be applied to dummy word lines coupled to respective dummy memory cells.

Figure 4:
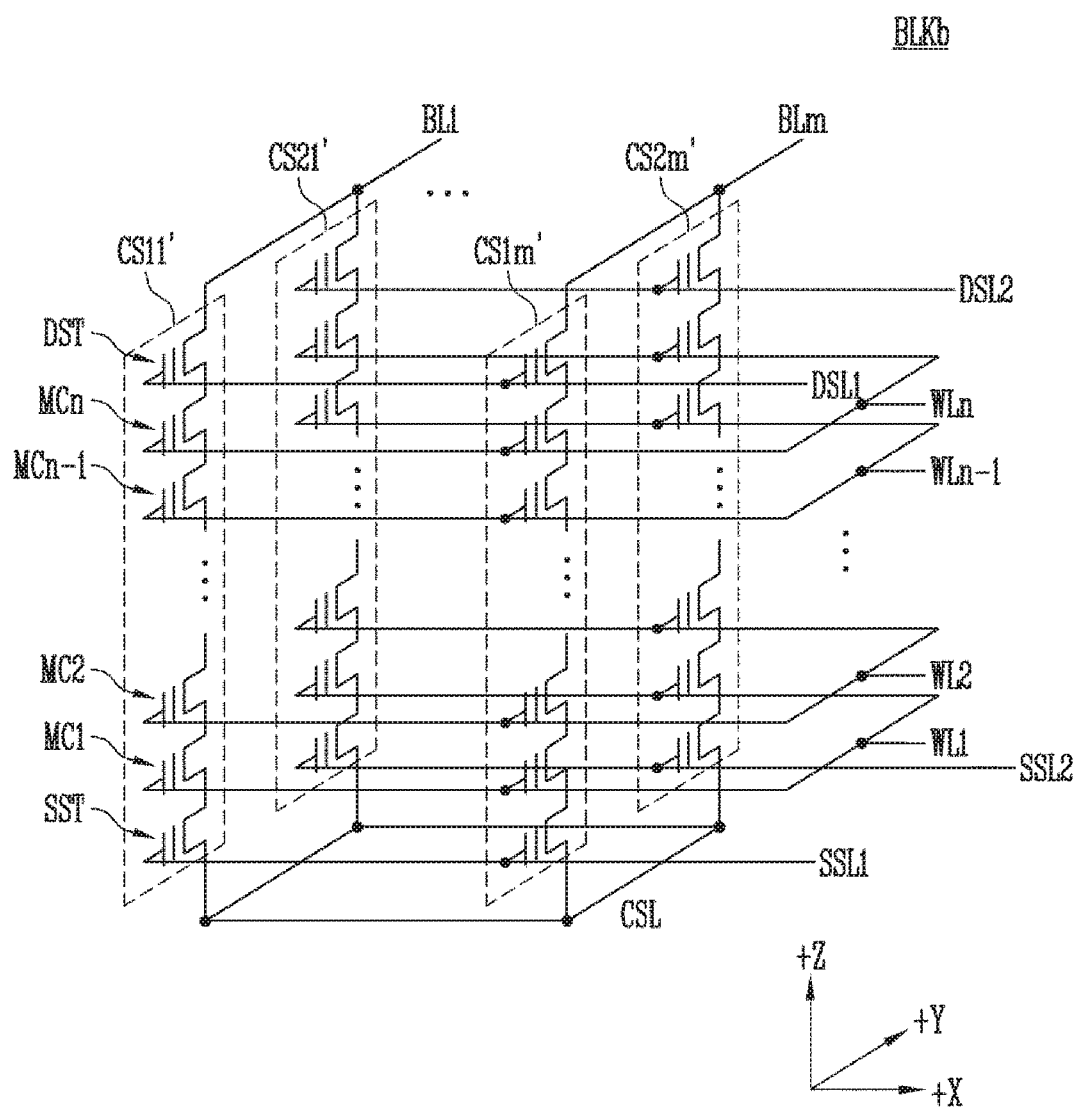
FIG. 4 is a circuit diagram illustrating an example of any one memory block BLKb of the memory blocks BLK1 to BLKz of FIG. 2.

FIG. 4 is a circuit diagram illustrating an example of any one memory block BLKb of the memory blocks BLK1 to BLKz of FIG. 2.

Referring to FIG. 4, the memory block BLKb may include a plurality of cell strings CS11' to CS1m' and CS21' to CS2m'. Each of the cell strings CS11' to CS1m' and CS21' to CS2m' extends in a positive (+) Z direction. Each of the cell strings CS11' to CS1m' and CS21' to CS2m' includes at least one source select transistor SST, first to n-th memory cells MC1 to MCn, and at least one drain select transistor DST, which are stacked on a substrate (not illustrated) below the memory block BLKb.

The source select transistor SST in each cell string is connected between a common source line CSL and memory cells MC1 to MCn. The source select transistors of cell strings arranged in the same row are coupled to the same source select line. Source select transistors of cell strings CS11' to CS1m' arranged in a first row are coupled to a first source select line SSL1. Source select transistors of cell strings CS21' to CS2m' arranged in a second row are coupled to a second source select line SSL2. In an embodiment, source select transistors of the cell strings CS11' to CS1m' and CS21' to CS2m' may be coupled in common to a single source select line.

The first to n-th memory cells MC1 to MCn in each cell string are connected in series between the source select transistor SST and the drain select transistor DST. The gates of the first to n-th memory cells MC1 to MCn are coupled to first to n-th word lines WL1 to WLn, respectively.

The drain select transistor DST in each cell string is connected between the corresponding bit line and the memory cells MC1 to MCn. Drain select transistors of cell strings arranged in a row direction are coupled to drain select lines extended in the row direction. The drain select transistors of the cell strings CS11' to CS1m' in the first row are coupled to a first drain select line DSL1. The drain select transistors of the cell strings CS21' to CS2m' in the second row are coupled to a second drain select line DSL2.

Consequentially, the memory block BLKb of FIG. 4 may have an equivalent circuit similar to that of the memory block BLKa of FIG. 3 except that a pipe transistor PT is excluded from each cell string.

In an embodiment, instead of the first to m-th bit lines BL1 to BLm, even bit lines and odd bit lines may be provided. Even-numbered cell strings, among the cell strings CS11' to CS1m' or CS21' to CS2m' arranged in a row direction, may be coupled to respective even bit lines. Odd-numbered cell strings, among the cell strings CS11' to CS1m' or CS21' to CS2m' arranged in the row direction, may be coupled to respective odd bit lines.

In an embodiment, one or more of the first to n-th memory cells MC1 to MCn may be used as dummy memory cells. For example, the one or more dummy memory cells are provided to reduce an electric field between the source select transistor SST and the memory cells MC1 to MCn. Alternatively, the one or more dummy memory cells are provided to reduce an electric field between the drain select transistor DST and the memory cells MC1 to MCn. As the number of dummy memory cells that are provided is increased, the reliability of operation of the memory block BLKb may be improved, whereas the size of the memory block BLKb may be increased. As the number of dummy memory cells that are provided is decreased, the size of the memory block BLKb may be decreased, whereas the reliability of operation of the memory block BLKb may be deteriorated.

In order to efficiently control the one or more dummy memory cells, respective dummy memory cells may have required threshold voltages. Before or after an erase operation on the memory block BLKb is performed, program operations may be performed on all or some of the dummy memory cells. When the erase operation is performed after the program operations have been performed, the respective dummy memory cells may have required threshold voltages by controlling voltages to be applied to dummy word lines coupled to respective dummy memory cells.

Figure 5:
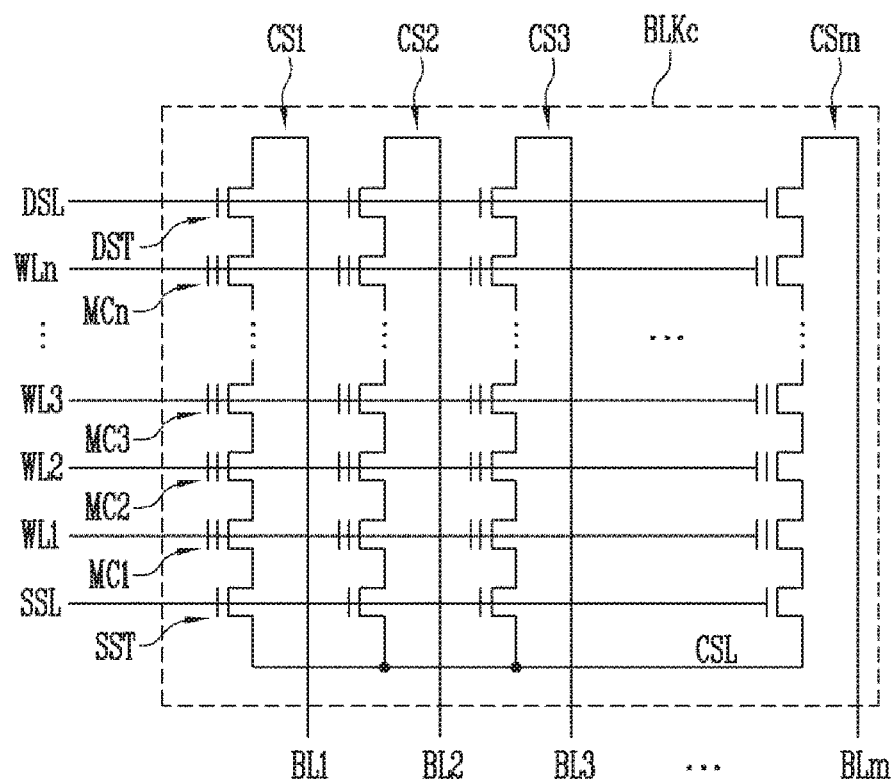
FIG. 5 is a circuit diagram illustrating an example of any one memory block BLKc of a plurality of memory blocks BLK1 to BLKz included in the memory cell array of FIG. 1.

FIG. 5 is a circuit diagram illustrating an example of any one memory block BLKc of a plurality of memory blocks BLK1 to BLKz included in the memory cell array 110 of FIG. 1.

Referring to FIG. 5, the memory block BLKc may include a plurality of cell strings CS1 to CSm. The plurality of cell strings CS1 to CSm may be coupled to a plurality of bit lines BL1 to BLm, respectively. Each of the cell strings CS1 to CS1m includes at least one source select transistor SST, first to n-th memory cells MC1 to MCn, and at least one drain select transistor DST.

The select transistors SST and DST and the memory cells MC1 to MCn may have similar structures. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST in each cell string is coupled between the common source line CSL and the memory cells MC1 to MCn.

The first to n-th memory cells MC1 to MCn in each cell string are coupled between the source select transistor SST and the drain select transistor DST.

The drain select transistor DST in each cell string is coupled between the corresponding bit line and the memory cells MC1 to MCn.

The memory cells coupled to the same word line may constitute a single page. The cell strings CS1 to CSm may be selected by selecting the drain select line DSL. One page may be selected from the selected cell strings by selecting any one of the word lines WL1 to WLn.

In an embodiment, instead of the first to m-th bit lines BL1 to BLm, even bit lines and odd bit lines may be provided. Among the cell strings CS1 to CSm, even-numbered cell strings may be coupled to the even bit lines, respectively, and odd-numbered cell strings may be coupled to the odd bit lines, respectively.

Figure 6:
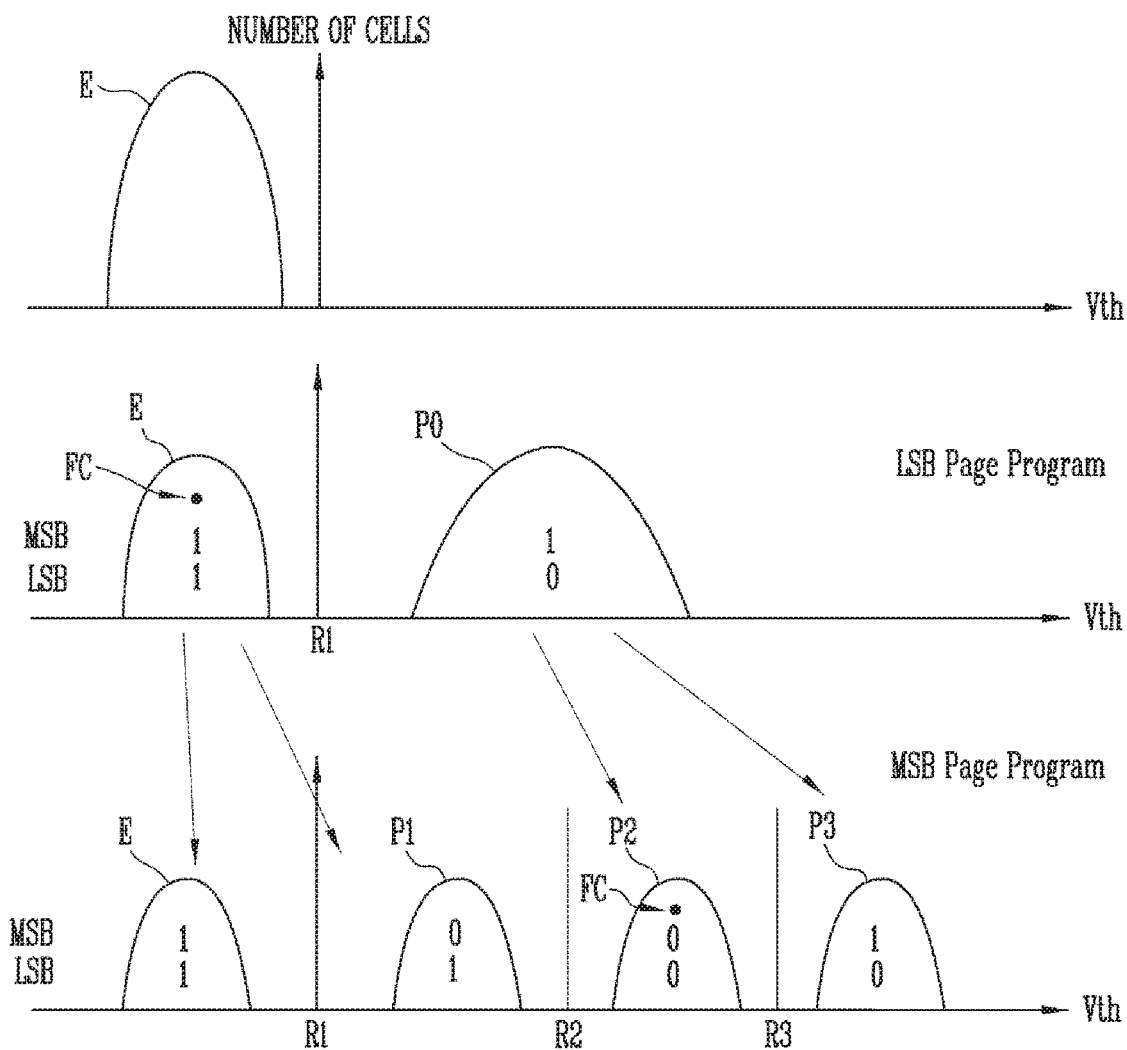
FIG. 6 is a diagram illustrating threshold voltage distributions of memory cells depending on a LSB programming operation of a page and a MSB programming operation of the page.

FIG. 6 is a diagram illustrating threshold voltage distributions of memory cells depending on a LSB programming operation of a page and an MSB programming operation of the page.

Referring to FIG. 6, before memory cells are programmed, the memory cells are maintained in an erase state E. Thereafter, as a program operation progresses, a memory cell for storing 2-bit data is maintained in the following two states. By means of an LSB program operation, the memory cells are maintained in the erase state E or a temporary program state P0. Thereafter, by means of an MSB program operation, the memory cells are maintained in the erase state E or any one of a first program state P1, a second program state P2, and a third program state P3.

First, referring to FIG. 6, a program procedure on a 2-bit memory cell is described below. When data to be programmed is "10", '0' denotes Least Significant Bit (LSB) data, and '1' denotes Most Significant Bit (MSB) data. When the LSB program operation is performed on an erased memory cell, the memory cell has an erase state E corresponding to data "11" or a temporary program state P0 corresponding to data "10" depending on the level of the threshold voltage Vth of the memory cell. Here, a first read voltage R1 may be disposed between the erase state E and the first program state P1.

Thereafter, when the MSB program operation is performed, the memory cell in the temporary program state P0 is programmed to the second program state P2 corresponding to data "00" or to the third program state P3 corresponding to data "10". Further, the memory cell in the erase state E corresponding to data "11" is programmed to state P1 corresponding to data "01". Here, the first read voltage R1 may be disposed between the erase state E and the first program state P1, a second read voltage R2 may be disposed between the first program state P1 and the second program state P2, and a third read voltage R3 may be disposed between the second program state P2 and the third program state P3.

Here, a flag cell FC is a memory cell for determining whether the corresponding page has been programmed up to a MSB. That is, depending on the threshold voltage of the flag cell FC, whether the corresponding page has been LSB-programmed or MSB-programmed is determined. That is, the flag cell FC is not programmed at an LSB program step, and the flag cell FC is programmed at a MSB program step. Although, in FIG. 6, an example, in which the flag cell FC is programmed to the second program state P2 greater than the second read voltage R2 when the memory cell is MSB-programmed, has been described, the present disclosure is not limited thereto. If necessary, when the memory cell is MSB-programmed, the flag cell FC may be programmed to the third program state P3.

Figure 7:
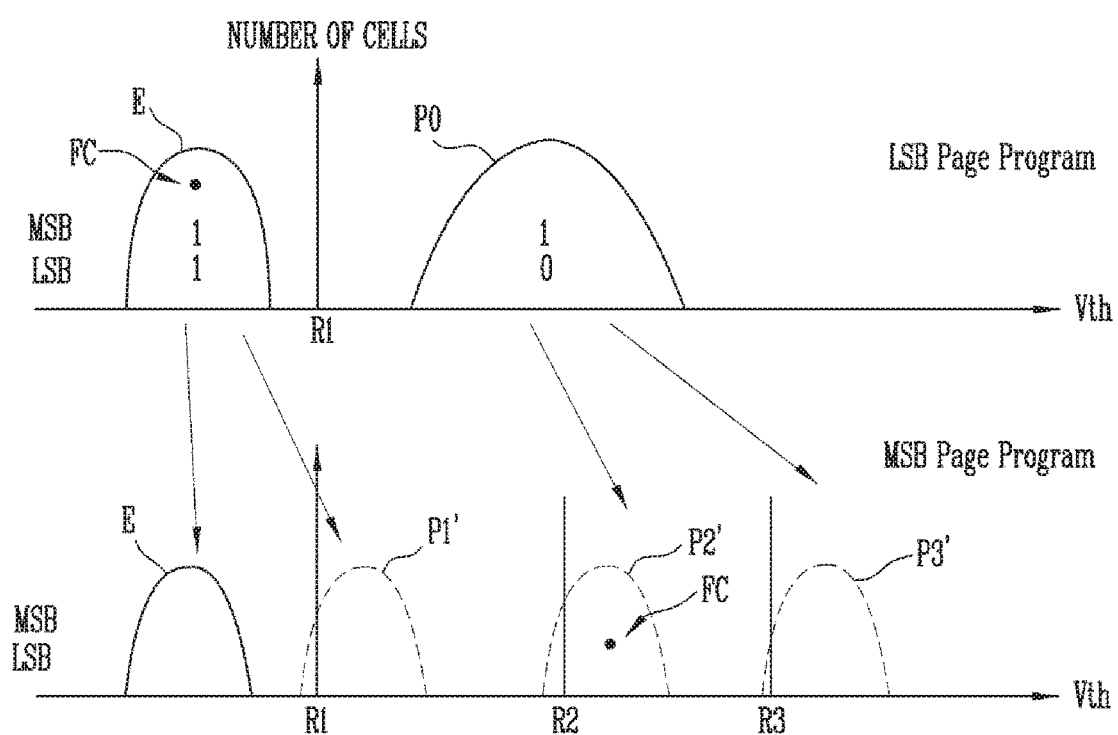
FIG. 7 is a diagram illustrating threshold voltage distributions of memory cells when a sudden power-off (SPO) occurs in a state in which a sufficiently large number of MSB programming loops for a page are in progress.

FIG. 7 is a diagram illustrating threshold voltage distributions of memory cells when a sudden power-off (SPO) occurs in a state in which a sufficiently large number of MSB page program loops are in progress. Further, FIG. 8 is a diagram illustrating threshold voltage distributions of memory cells when a sudden power-off occurs at the initial stage of the MSB page program loops.

First, referring to FIG. 7, threshold voltage distributions of memory cells, appearing when a sudden power-off (SPO) occurs after a sufficiently large number of program loops have progressed, are illustrated. When an MSB read operation is performed, MSB data is read as '0' from memory cells between the first read voltage R1 and the third read voltage R3, the memory cells are in an interrupt state while a program operation progresses together with MSB error correcting code (ECC) data. Therefore, the read MSB data is determined to be uncorrectable data, so that a memory controller or an external chip controller may recognize such an MSB data error and performs a series of predetermined data recovery tasks against the MSB data error, thus securing data reliability.

Figure 8:
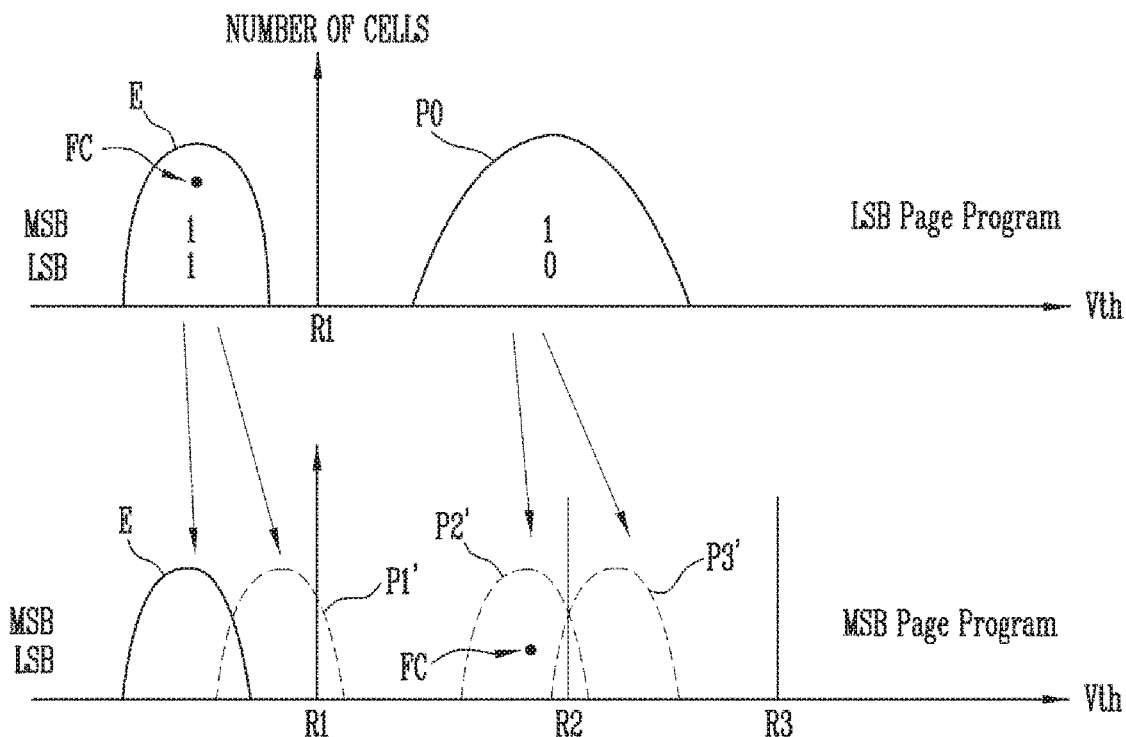
FIG. 8 is a diagram illustrating threshold voltage distributions of memory cells when a sudden power-off occurs at the initial stage of the MSB programming loops for a page.

Referring to FIG. 8, threshold voltage distributions, appearing when a sudden power-off occurs after a relatively small number of program loops have progressed, are illustrated. In this case, very few of memory cells in the erase state E are programmed to a state exceeding the first read voltage. In this case, since the number of pieces of ECC data for LSB stored in an error detection cell is much smaller than the number of memory cells, the ECC data for LSB may not be probabilistically programmed compared to the memory cells. Here, when an LSB read operation is performed, the flag cell FC, determined first at the second read voltage R2, is in an erase state, and thus the LSB read operation is updated at the first read voltage R1 and then the read operation is performed. As a result, since very few of the memory cells have been programmed from the erase state E to a state in which the threshold voltage thereof is higher than the first read voltage R1, the read data is determined to be ECC correctable data. Further, when an MSB read operation is performed, the read operation is performed at the first read voltage R1, and the flag cell FC is programmed, so that MSB data is recognized as being programmed. Thus, the MSB data is read based on the third read voltage R3, and then MSB data of the memory cells falling within a range between the first read voltage R1 and the second read voltage R2 is recognized as "0". Further, in the remaining range, data is recognized as "1". As a result, the MSB data is read as the same data as previous LSB data at the same time that LSB ECC data originally applied to the LSB data is read as MSB ECC data without change, and thus the MSB ECC data is determined to be ECC correctable data. That is, MSB data error caused by the occurrence of an instantaneous power-off may not be recognized, and thus the operation reliability of the semiconductor memory device 100 is deteriorated.

In accordance with the semiconductor memory device and the method of operating the semiconductor memory device according to the present disclosure, a program operation on a flag cell FC and a MSB of a page is performed based on the operation of verifying at least one program state. Accordingly, since the program operation on the flag cell FC is initiated after a sufficiently large number of MSB program loops have been executed, the above-described problem may be solved. Therefore, the operation reliability of the semiconductor memory device may be improved.

Figure 9:
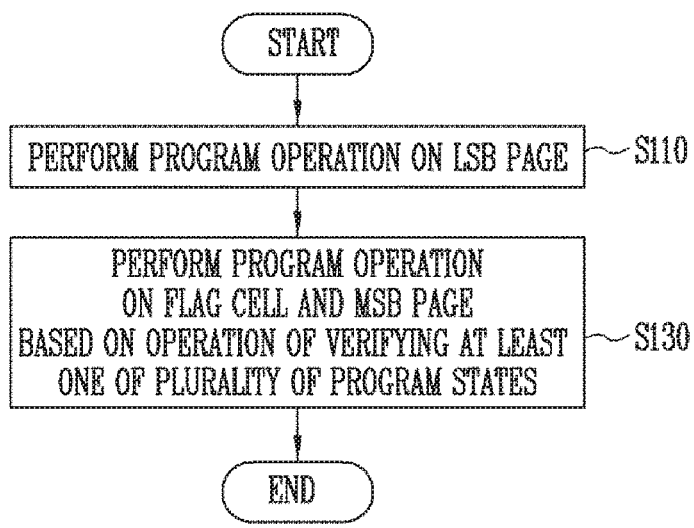
FIG. 9 is a flowchart illustrating a method of operating a semiconductor memory device according to an embodiment of the present disclosure.

FIG. 9 is a flowchart illustrating a method of operating a semiconductor memory device according to an embodiment of the present disclosure. Referring to FIG. 9, the method of operating the semiconductor memory device according to an embodiment of the present disclosure may include the step S110 of performing a program operation on a Least Significant Bit (LSB) of a page, and the step S130 of performing a program operation on a flag cell and a Most Significant Bit (MSB) of a page based on an operation of verifying at least one of a plurality of program states. Data stored in the flag cell is data indicating whether data programmed according to the program operation is LSB data or MSB data.

At step S110, the program operation on the LSB of a page of memory cells, each storing 2-bit data, is performed. Since the program operation on the LSB of a page is identical to that described above with reference to FIG. 6, a repeated description thereof will be omitted.

At step S130, the program operation on the flag cell and the MSB of the page is performed based on the operation of verifying at least one program state. For this operation, step S130 may be divided into a first program procedure and a second program procedure. The first program procedure is the step of executing program loops on memory cells except the flag cell FC, and the second program procedure is the step of executing program loops on the memory cells including the flag cell FC. In accordance with the method of operating the semiconductor memory device according to the present disclosure, a criterion for going on to the second program procedure from the first program procedure is whether the operation of verifying a specific program state has been completed. That is, when the operation of verifying the specific program state is completed during the first program procedure, the first program procedure is terminated, and the second program procedure is initiated. A description of the first program procedure and the second program procedure will be made below with reference to FIGS. 10 to 15C.

Figure 10:
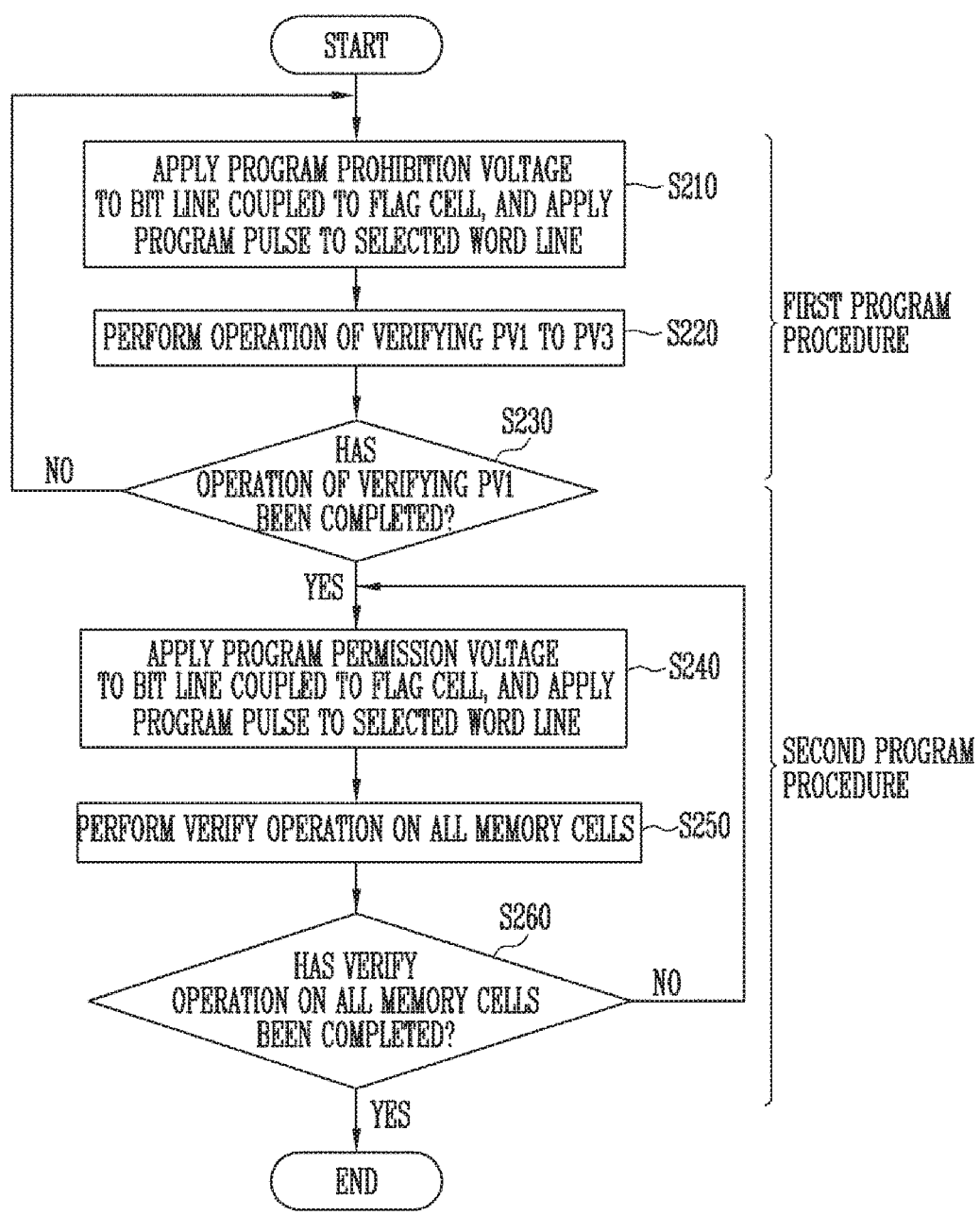
FIG. 10 is a flowchart illustrating a MSB programming step for a page of FIG. 9.

FIG. 10 is a flowchart illustrating the MSB programming step for the page of FIG. 9.

Referring to FIG. 10, MSB programming of the page at step S130 includes a first program procedure and a second program procedure as illustrated. First, the first program procedure includes the step S210 of applying a program prohibition voltage to a bit line coupled to a flag cell and applying a program pulse to a selected word line, the step S220 of performing an operation of verifying first to third program states PV1 to PV3, and the step S230 of determining whether the operation of verifying the first program state PV1 has been completed. At step S210, the program prohibition voltage is applied to the bit line coupled to the flag cell FC, a program permission voltage is applied to bit lines coupled to the remaining cells, and the program pulse is applied to word lines coupled to the flag cell FC and to the remaining cells, and thus the program operation is performed. That is, since the program prohibition voltage is applied to the bit line coupled to the flag cell FC, the threshold voltage of the flag cell FC does not change even if the program pulse is applied to the word line coupled to the flag cell FC.

When the operation of verifying the first program state PV1 is completed, the first program procedure is terminated, and the process enters the second program procedure. When the operation of verifying the first program state PV1 is not completed, the process returns to step S210, and the first program procedure is repeated. As step S210 is repeatedly performed, the number of memory cells on which verification of the first program state PV1 has been completed is gradually increased. Finally, if verification of all memory cells corresponding to the first program state PV1 has been completed, the first program procedure is terminated.

When the second program procedure is initiated, the step S240 of applying a program permission voltage to the bit line coupled to the flag cell FC and applying a program pulse to the selected word line, the step S250 of performing a verify operation on all memory cells, and the step S260 of determining whether the verify operation on all memory cells has been completed are performed. As step S240 is performed, a program operation on the flag cell FC is performed. At step S240, the program permission voltage is applied to the bit line coupled to the flag cell FC, and the program pulse is applied to the word lines coupled to the flag cell FC and to the remaining cells, and thus the program operation is performed. That is, since the program permission voltage is applied to the bit line coupled to the flag cell FC, the threshold voltage of the flag cell FC starts to change if the program pulse is applied to the word line coupled to the flag cell FC.

When the verify operation on all memory cells is completed, the second program procedure is terminated, and thus the MSB program operation for a page is terminated. When the verify operation on all memory cells is not completed, the process returns to step S240, and the second program procedure is repeated.

Figure 11:
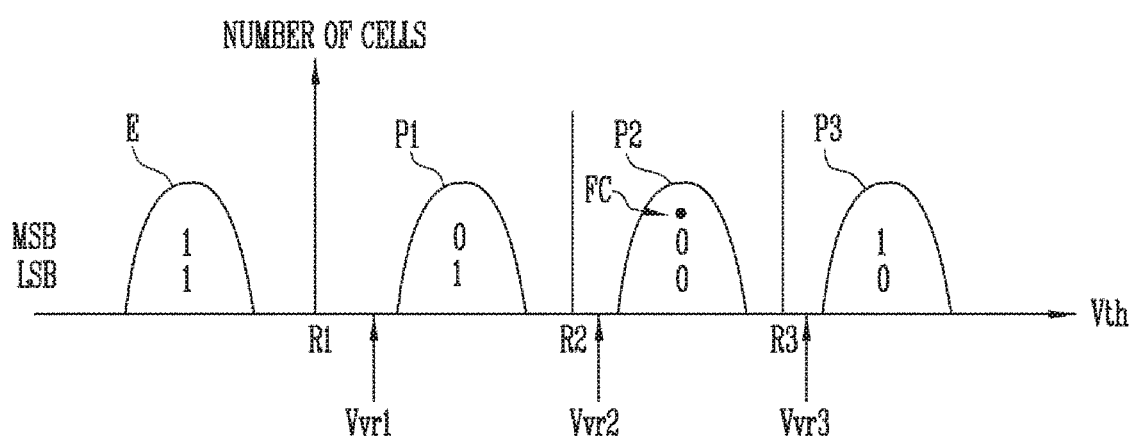
FIG. 11 is a diagram for explaining verify voltages for respective program states.

FIG. 11 is a diagram for explaining the verify voltages for respective program states.

Referring to FIG. 11, a first verify voltage Vvr1 having a voltage value higher than a first read voltage R1, a second verify voltage Vvr2 having a voltage value higher than a second read voltage R2, and a third verify voltage Vvr3 having a voltage value higher than a third read voltage R3 are illustrated. The verify operations at steps S220 and S250 are performed based on the above-described first to third verify voltages Vvr1 to Vvr3.

Figure 12:
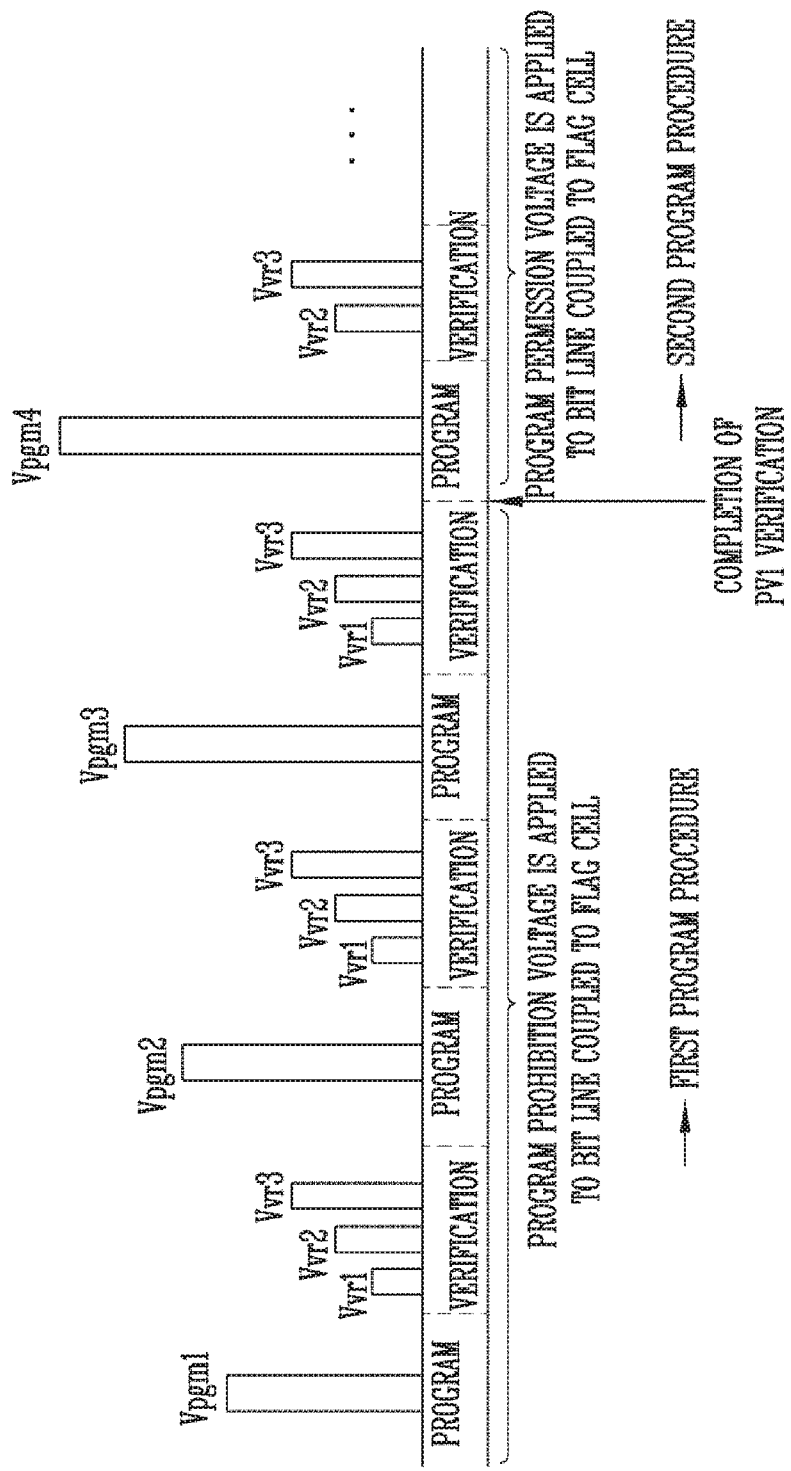
FIG. 12 is a diagram for explaining the MSB programming operation for a page referred to by the description relating to FIG. 10.

FIG. 12 is a diagram for explaining the MSB programming operation for the page discussed with regards to FIG. 10.

Referring to FIG. 12, the method for the MSB programming operation of the page regarding FIG. 10 is described using pulses that are applied to word lines. In FIG. 12, a program loop composed of program and verification is repeatedly illustrated. Further, in FIG. 12, only a procedure of a MSB programming of a page is illustrated, and an illustration for the LSB programming for the page is omitted.

Referring to FIG. 12, as the procedure for the MSB programming of the page is initiated, a first program procedure is initiated. A first program pulse Vpgm1 is applied, and first to third verify voltages Vvr1 to Vvr3 are applied, and thus a first program loop is executed. As a result of execution of the first program loop, if verification of the first program state PV1 is not completed, a second program loop is executed. Accordingly, a second program voltage Vpgm2 and the first to third verify voltages Vvr1 to Vvr3 are sequentially applied.

In this way, each program loop is executed until the verification of the first program state PV1 is completed. During the first program procedure, the program prohibition voltage is applied to the bit line coupled to the flag cell. Accordingly, even if the program pulse is applied to the word line coupled to the flag cell, the threshold voltage of the flag cell does not change. In FIG. 12, it can be seen that the verification of the first program state PV1 has been completed by a third program loop. When the verification of the first program state PV1 is completed, the first program procedure is terminated.

The second program procedure is initiated. A fourth program pulse Vpgm4 and second and third verify voltages Vvr2 and Vvr3 are applied, and thus a fourth program loop is executed. During this procedure, the program permission voltage is applied to the bit line coupled to the flag cell FC. Accordingly, if the program pulse is applied to the word line coupled to the flag cell, the threshold voltage of the flag cell changes. Therefore, a program operation on the flag cell is initiated. As described above, in accordance with the semiconductor memory device and the method of operating the semiconductor memory device according to the present disclosure, the program operation on the flag cell is initiated after the operation of verifying the first program state PV1 has been completed, thus improving the operation reliability of the semiconductor memory device.

Figure 13:
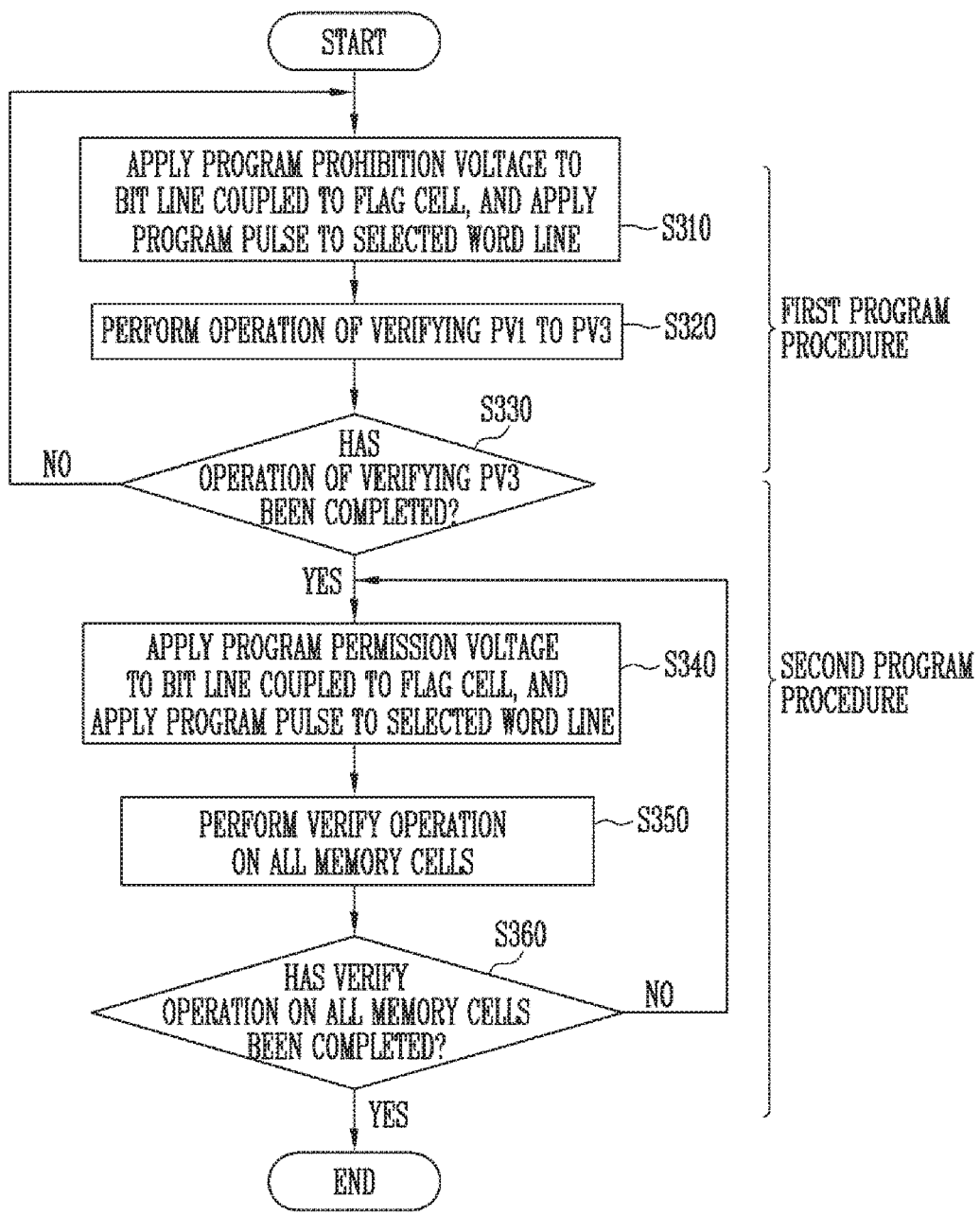
FIG. 13 is a flowchart illustrating a method of operating a semiconductor memory device according to an embodiment of the present disclosure.

FIG. 13 is a flowchart illustrating a method of operating a semiconductor memory device according to an embodiment of the present disclosure.

Referring to FIG. 13, MSB programming of the page in step S130 of FIG. 9 may include a first program procedure and a second program procedure as illustrated. First, the first program procedure includes the step S310 of applying a program prohibition voltage to a bit line coupled to a flag cell and applying a program pulse to a selected word line, the step S320 of performing an operation of verifying first to third program states PV1 to PV3, and the step S330 of determining whether the operation of verifying the third program state PV3 has been completed. At step S310, the program prohibition voltage is applied to the bit line coupled to the flag cell FC, a program permission voltage is applied to bit lines coupled to the remaining cells, and the program pulse is applied to a word line coupled to the flag cell FC and to the remaining cells, and thus the program operation is performed. That is, since the program prohibition voltage is applied to the bit line coupled to the flag cell FC, the threshold voltage of the flag cell FC does not change even if the program pulse is applied to the word line coupled to the flag cell FC.

When the operation of verifying the third program state PV3 is completed, the first program procedure is terminated, and the process enters the second program procedure. When the operation of verifying the third program state PV3 is not completed, the process returns to step S310, and the first program procedure is repeated. As step S310 is repeatedly performed, the number of memory cells on which the verification of the third program state PV3 has been completed is gradually increased. Finally, if verification of all memory cells corresponding to the third program state PV3 has been completed, the first program procedure is terminated.

When the second program procedure is initiated, the step S340 of applying a program permission voltage to the bit line coupled to the flag cell FC and applying a program pulse to the selected word line, the step S350 of performing a verify operation on all memory cells, and the step S360 of determining whether the verify operation on all memory cells has been completed are performed. As step S340 is performed, a program operation on the flag cell FC is performed. At step S340, the program permission voltage is applied to the bit line coupled to the flag cell FC, and the program pulse is applied to the word lines coupled to the flag cell FC and to the remaining cells, and thus the program operation is performed. That is, since the program permission voltage is applied to the bit line coupled to the flag cell FC, the threshold voltage of the flag cell FC starts to change if the program pulse is applied to the word line coupled to the flag cell FC.

When the verify operation on all memory cells is completed, the second program procedure is terminated, and thus the MSB program operation of the page is terminated. When the verify operation on all memory cells is not completed, the process returns to step S340, and the second program procedure is repeated.

The embodiments of FIG. 13 are different from that of FIG. 10 in that the process enters the second program procedure from the first program procedure depending on whether the operation of verifying the third program state PV3, other than the first program state PV1, has been completed.

Figure 14:
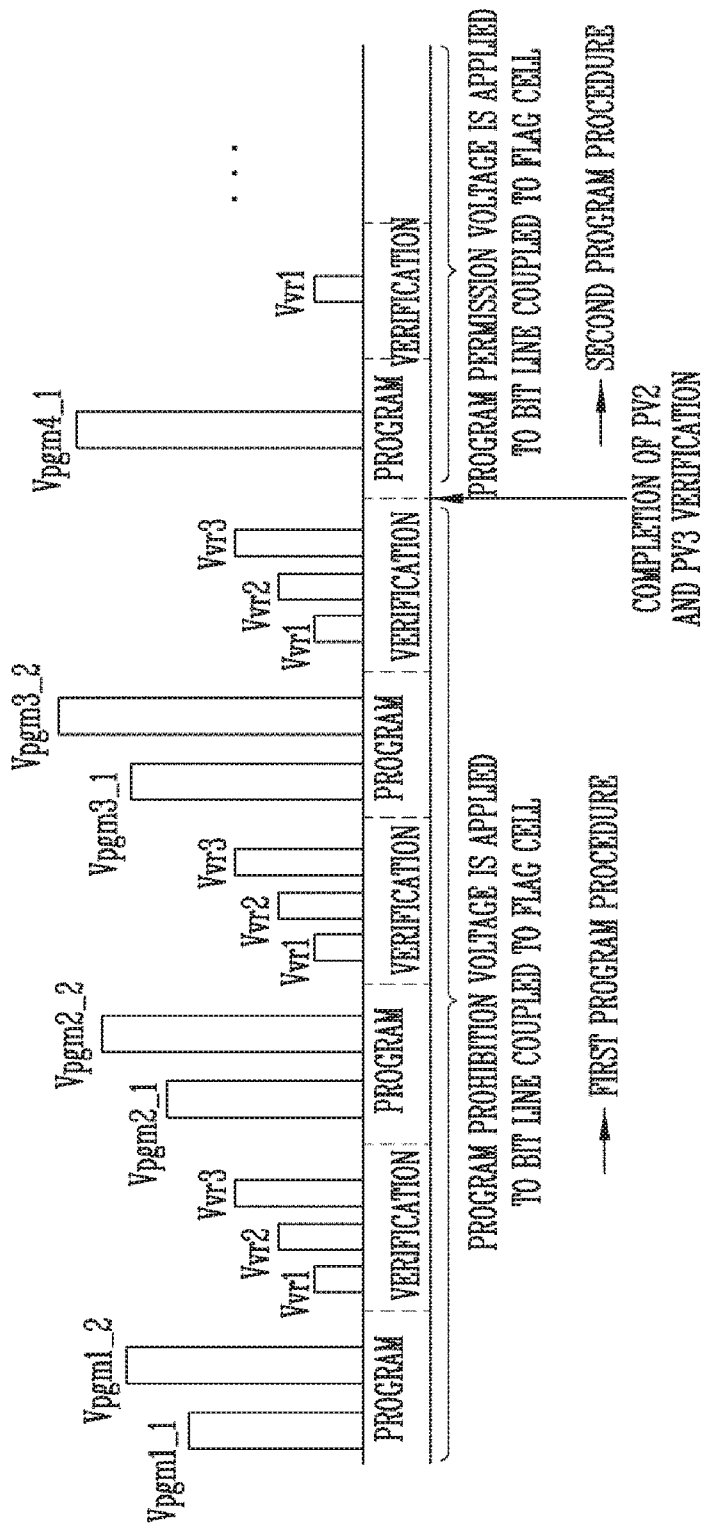
FIG. 14 is a diagram for explaining a MSB programming operation for a page referred to by the description relating to FIG. 13.

FIG. 14 is a diagram for explaining a MSB program operation for the page referred to FIG. 13.

Referring to FIG. 14, the method of the MSB program operation of the page of FIG. 13 is described using pulses that are applied to word lines. In FIG. 14, a program loop composed of program and verification is repeatedly illustrated. Further, in FIG. 14, only a MSB programming procedure of a page is illustrated, and illustration of the LSB programming procedure of the page is omitted.

Referring to FIG. 14, as the procedure for the MSB programming of the page is initiated, a first program procedure is initiated. A first pulse pair of Vpgm1_1 and Vpgm1_2 is applied, and first to third verify voltages Vvr1 to Vvr3 are applied, and thus a first program loop is executed. Of the pulses Vpgm1_1 and Vpgm1_2 of the first pulse pair, the program pulse Vpgm1_1 may be applied to memory cells in an erase state E, and the program pulse Vpgm1_2 may be applied to memory cells in a temporary program state P0. As described above, operation speed may be improved by applying two program pulses within a single program loop.

As a result of execution of the first program loop, if verification of the third program state PV3 is not completed, a second program loop is executed. Accordingly, a second pulse pair of Vpgm2_1 and Vpgm2_2 is applied, and the first to third verify voltages Vvr1 to Vvr3 are sequentially applied.

In this way, the program loops are executed until the verification of the third program state PV3 is completed. During the first program procedure, the program prohibition voltage is applied to the bit line coupled to the flag cell. Accordingly, even if the program pulse is applied to the word line coupled to the flag cell, the threshold voltage of the flag cell does not change. In FIG. 14, it can be seen that the verification of the third program state PV3 has been completed by a third program loop. As the verification of the third program state PV3 is completed, the first program procedure is terminated.

The second program procedure is initiated. A fourth pulse Vpgm4_1 and the first verify voltage Vvr1 are applied, and thus a fourth program loop is executed. During this procedure, the program permission voltage is applied to the bit line coupled to the flag cell FC. Accordingly, if the program pulse is applied to the word line coupled to the flag cell, the threshold voltage of the flag cell changes. Therefore, a program operation on the flag cell is initiated. As described above, in accordance with the semiconductor memory device and the method of operating the semiconductor memory device according to the present disclosure, the program operation on the flag cell is initiated after the operation of verifying the third program state PV3 has been completed, thus improving the operation reliability of the semiconductor memory device.

Figure 15A:
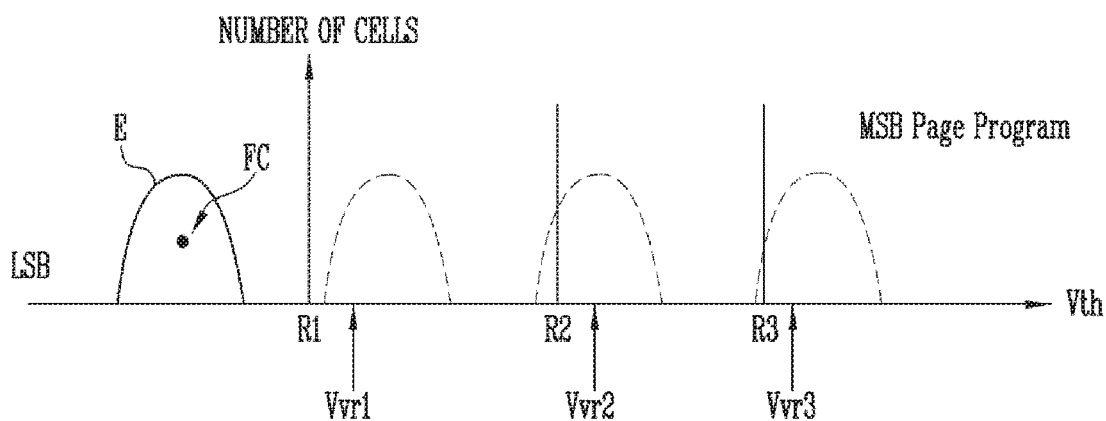
FIG. 15A is a diagram illustrating a threshold voltage of a flag cell in a first program procedure illustrated in FIGS. 10, 12, 13, and 14.

FIG. 15A is a diagram illustrating a threshold voltage of a flag cell in the first program procedure illustrated in FIGS. 10, 12, 13, and 14.

Referring to FIG. 15A, in the first program procedure, a program prohibition voltage is applied to a bit line coupled to the flag cell, and a program pulse is applied to a word line coupled to a page including the flag cell. Therefore, a program operation on memory cells except the flag cell, among memory cells coupled to the selected word line, is initiated. That is, the threshold voltages of memory cells corresponding to the first to third program states are gradually increased. The program prohibition voltage is applied to the bit line coupled to the flag cell FC, and thus the threshold voltage of the flag cell FC is maintained.

Figure 15B:
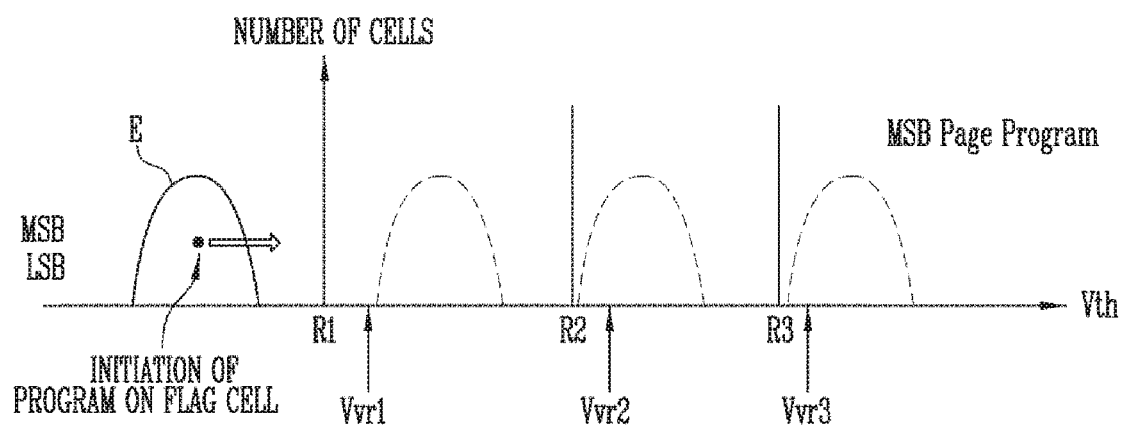
FIG. 15B is a diagram for explaining a program operation on a flag cell in a second program procedure illustrated in FIGS. 10 and 12.

FIG. 15B is a diagram for explaining a program operation on a flag cell in the second program procedure illustrated in FIGS. 10 and 12.

Referring to FIG. 15B, the operation of verifying a first program state PV1 is completed, and thus a program permission voltage starts to be applied to a bit line coupled to the flag cell FC, as illustrated in FIGS. 10 and 12. Accordingly, when the program pulse is applied to a word line coupled to the flag cell FC, the threshold voltage of the flag cell FC starts to be increased. As the second program procedure progresses, the threshold voltage of the flag cell FC may be gradually increased up to a target voltage level.

Figure 15C:
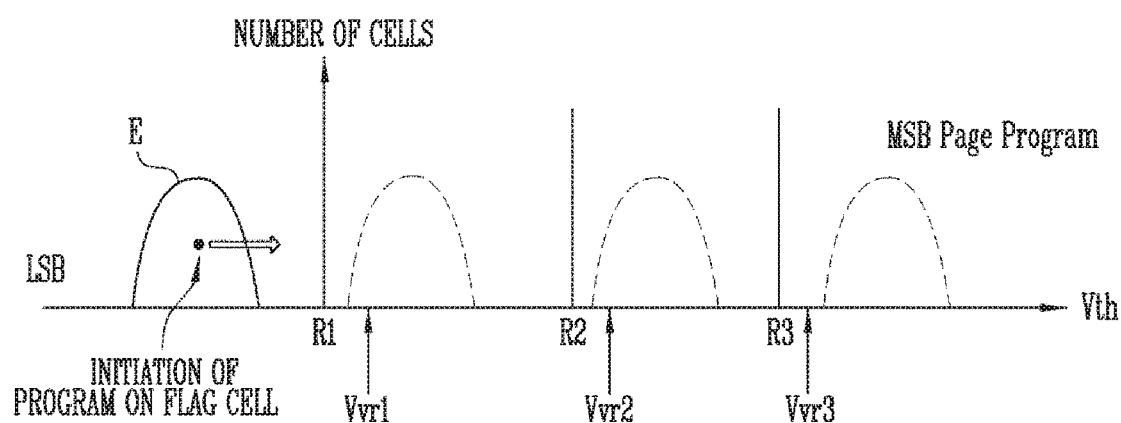
FIG. 15C is a diagram for explaining a program operation on a flag cell in the second program procedure illustrated in FIGS. 13 and 14.

FIG. 15C is a diagram for explaining a program operation on a flag cell in the second program procedure illustrated in FIGS. 13 and 14.

Referring to FIG. 15B, the operation of verifying a third program state PV3 is completed, and thus a program permission voltage starts to be applied to a bit line coupled to the flag cell FC, as illustrated in FIGS. 13 and 14. Accordingly, when the program pulse is applied to a word line coupled to the flag cell FC, the threshold voltage of the flag cell FC starts to be increased. As the second program procedure progresses, the threshold voltage of the flag cell FC may be gradually increased up to a target voltage level.

As described above, in accordance with the semiconductor memory device and the method of operating the semiconductor memory device according to embodiments of the present disclosure, the program of a flag cell FC is initiated after the operation of verifying a specific program state has been completed. Accordingly, when a sudden power-off occurs during a program operation, a data error may be more precisely identified, and the operation reliability of the semiconductor memory device may be improved.

Referring to FIGS. 10 to 15C, a method of programming a flag cell in a program operation of a multi-level cell which stores 2-bit data is illustrated. However, the semiconductor memory device and the method of operating the semiconductor memory device according to an embodiment of the present disclosure are not limited thereto. The above programming method is applicable to memory cells each of which stores 3 or more bits of data.

For example, in a memory cell array including memory cells each of which stores N-bit data, a single physical page may store N logical pages, where N may be a natural number of 2 or more. After (N−1)-th page data is programmed, N-th page data may be programmed. When the N-th page data is programmed, selected memory cells may be programmed to any one of an erase state and a $(2^N-1)$-th program state.

Here, a flag cell FC may be a memory cell for determining whether the corresponding physical page has been programmed with N-th page data. In other words, depending on a threshold voltage value of the flag cell FC, whether the corresponding physical page has been programmed with up to the (N−1)-th page data or the N-th page data may be determined. In other words, the flag cell FC may not be programmed at the program step of the (N−1)-th page data, and the flag cell FC may be programmed at the program step of the N-th page data.

In accordance with the semiconductor memory device and the method of operating the semiconductor memory device according to the present disclosure, during a program operation of the N-th page data, the program operation of the flag cell may be performed after a predetermined time. More specifically, after a verify operation on at least one of a first program state and a $(2^N-1)$th program state, among program states corresponding to the program operation of the N-th page data, is completed, a program operation for storing flag data in the flag cell may be initiated.

Figure 16A:
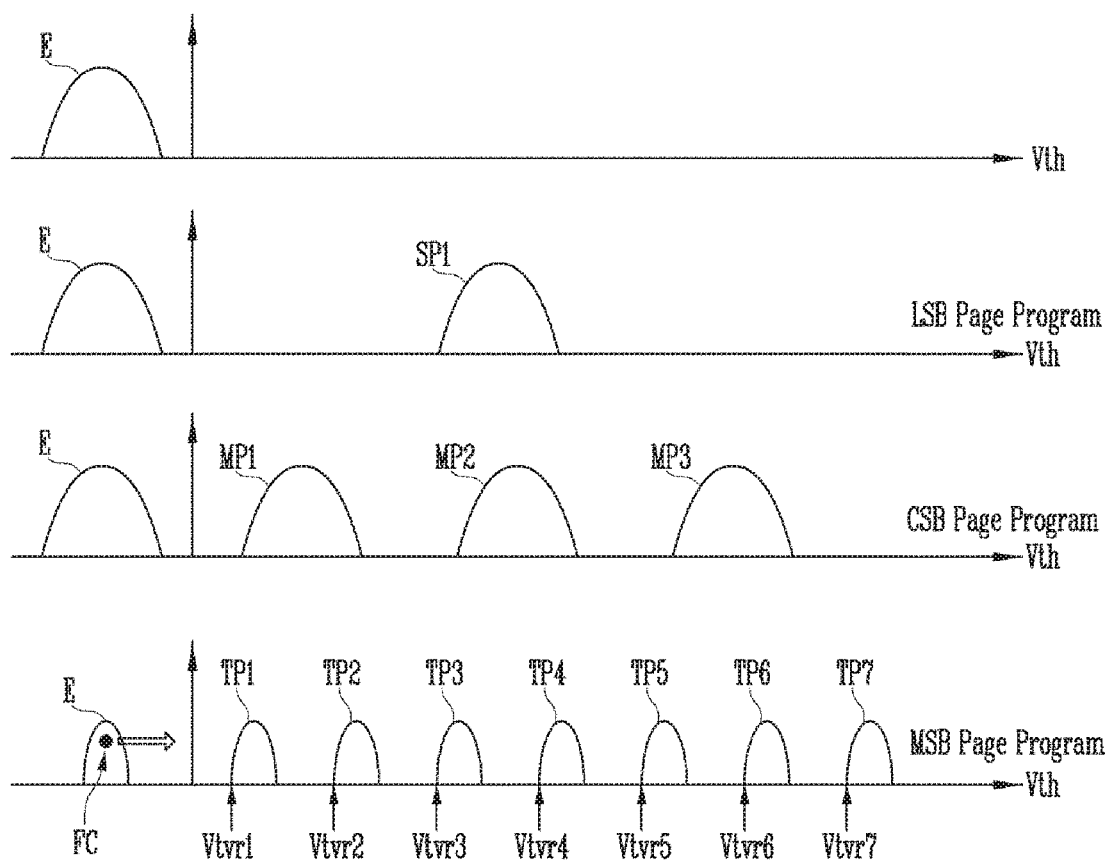
FIG. 16A is a diagram for explaining a program operation of triple-level cells (TLC) according to an embodiment of the present disclosure.

FIG. 16A is a diagram for explaining a program operation of triple-level cells (TLC) according to an embodiment of the present disclosure. Specifically, FIG. 16A is a diagram for explaining a case where the value of N is three (3).

Figure 16B:
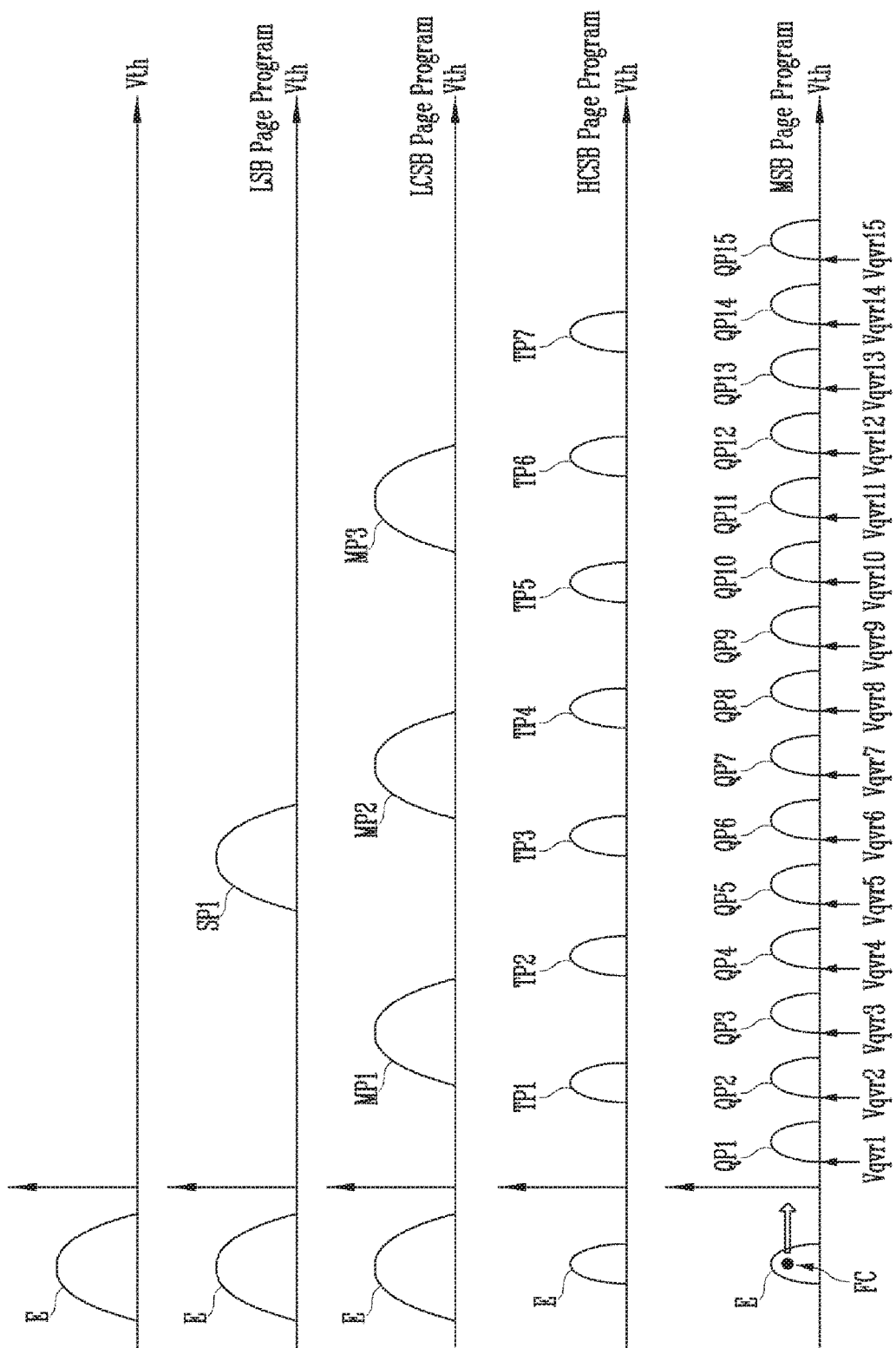
FIG. 16B is a diagram for explaining a program operation of quadruple-level cells (QLC) according to an embodiment of the present disclosure.

FIG. 16B is a diagram for explaining a program operation of quadruple-level cells (QLC) according to an embodiment of the present disclosure. Specifically, FIG. 16B is a diagram for explaining a case where the value of N is four (4).

Referring to FIG. 16A, a programming method of a TLC according to an embodiment of the present invention is shown. In FIG. 16A, the LSB program can be executed for the memory cells in the erase state E. As a result, the memory cells in the erase state E belong to either the erase state E or the program state SP1.

Thereafter, a Central Significant Bit (CSB) program operation may be performed on the selected memory cells. The selected memory cells belong to one of the erase state E and the first to third program states MP1 to MP3 by the CSB program operation.

FIG. 16A illustrates a program method where a CSB program operation is performed after an LSB program operation. However, according to the embodiment, the memory cells may be programmed to belong to the erase state E and the first to third program states MP1 to MP3 by the one-shot program method.

After the CSB program operation is performed, the MSB program operation may be performed. By the MSB program operation, the selected memory cells belong to the erase state E and the first to seventh program states TP1 to TP7. In order to program the memory cells in the first to seventh program states TP1 to TP7, the first to seventh verify voltages Vtvr1 to Vtvr7 may be used.

In the above example, the LSB page data may be the first page data, the CSB page data may be the second page data, and the MSB page data may be the third page data.

Here, a flag cell FC may be a memory cell for determining whether the corresponding physical page has been programmed with 3rd page data, i.e. the MSB page data. In other words, depending on a threshold voltage value of the flag cell FC, whether the corresponding physical page has been programmed with up to the CSB page data or the MSB page data may be determined. In other words, the flag cell FC may not be programmed at the program step of the CSB page data, and the flag cell FC may be programmed at the program step of the MSB page data.

In accordance with the semiconductor memory device and the method of operating the semiconductor memory device according to the present disclosure, during a program operation of the MSB page data in TLC programming, the program operation of the flag cell may be performed after a predetermined time. More specifically, after a verify operation on at least one of a first program state TP1 and a seventh program state TP7, among program states corresponding to the program operation of the MSB page data, is completed, a program operation for storing flag data in the flag cell may be initiated.

Referring to FIG. 16B, a programming method of a QLC according to an embodiment of the present invention is shown. In FIG. 16B, the LSB program can be executed for the memory cells in the erase state E. As a result, the memory cells in the erase state E belong to either the erase state E or the program state SP1.

Thereafter, a Low Central Significant Bit (LCSB) program operation may be performed on the selected memory cells. The selected memory cells belong to one of the erase state E and the first to third program states MP1 to MP3 by the LCSB program operation.

Thereafter, a High Central Significant Bit (HCSB) program operation may be performed on the selected memory cells. The selected memory cells belong to one of the erase state E and the first to third program states TP1 to TP7 by the HCSB program operation.

FIG. 16B illustrates a program method where an LSB program operation, a LCSB program operation and a HCSB program operation are sequentially performed. However, according to the embodiment, the memory cells may be programmed to belong to the erase state E and the first to third program states TP1 to TP7 by the one-shot program method.

After the HCSB program operation is performed, the MSB program operation may be performed. By the MSB program operation, the selected memory cells belong to the erase state E and the first to fifteenth program states QP1 to QP15. In order to program the memory cells in the first to fifteenth program states QP1 to QP15, the first to fifteenth verify voltages Vqvr1 to Vqvr15 may be used.

In the above example, the LSB page data may be the first page data, the LCSB page data may be the second page data, the HCSB page data may be the third page data and the MSB page data may be the fourth page data.

Here, a flag cell FC may be a memory cell for determining whether the corresponding physical page has been programmed with 4th page data, i.e. the MSB page data. In other words, depending on a threshold voltage value of the flag cell FC, whether the corresponding physical page has been programmed with up to the HCSB page data or the MSB page data may be determined. In other words, the flag cell FC may not be programmed at the program step of the HCSB page data, and the flag cell FC may be programmed at the program step of the MSB page data.

In accordance with the semiconductor memory device and the method of operating the semiconductor memory device according to the present disclosure, during a program operation of the MSB page data in QLC programming, the program operation of the flag cell may be performed after a predetermined time. More specifically, after a verify operation on at least one of a first program state QP1 and a fifteenth program state QP15, among program states corresponding to the program operation of the MSB page data, is completed, a program operation for storing flag data in the flag cell may be initiated.

Figure 17:
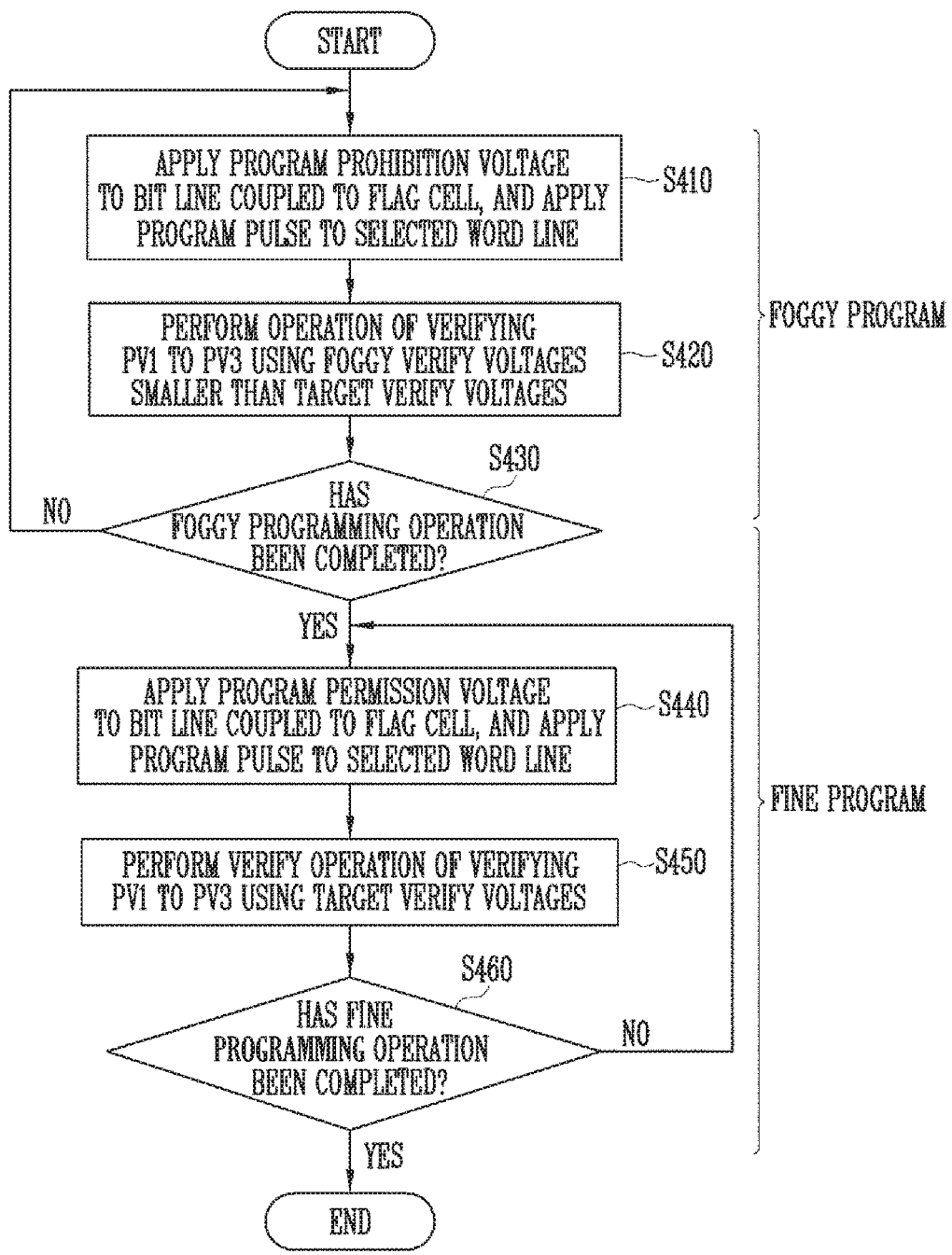
FIG. 17 is a flowchart illustrating a method of operating a semiconductor device according to another embodiment of the present disclosure.

FIG. 17 is a flowchart illustrating a method of operating a semiconductor memory device according to an embodiment of the present disclosure.

Referring to FIG. 17, another embodiment of the MSB programming of the page at step S130 of FIG. 9 is illustrated. More specifically, a time at which a flag cell is programmed during a foggy-fine programming operation may be controlled according to the embodiment illustrated in FIG. 17.

In FIG. 17, a foggy programming operation includes steps S410, S420, and S430, and a fine programming operation includes steps S440, S450, and S460. The foggy programming operation includes step S410 of applying a program prohibition voltage to a bit line coupled to a flag cell FC and applying a program pulse to a selected word line, S420 of performing an operation of verifying the first to third program states PV1 to PV3 using foggy verify voltages lower than target verify voltages, and S430 of determining whether the foggy programming operation has been completed. At step S410, a program operation may be performed by applying the program prohibition voltage to the bit line coupled to the flag cell FC, applying a program permission voltage to a bit line coupled to the remaining cells, and applying the program pulse to word lines coupled to the flag cell FC and the remaining cells. In other words, since the program prohibition voltage is applied to the bit line coupled to the flag cell FC, a threshold voltage of the flag cell FC does not be changed even when the program pulse is applied to the word line coupled to the flag cell FC.

During the foggy programming operation, as step S410 is repeatedly performed, a program pulse value may be increased. During the foggy programming operation, a step voltage for increasing the program pulse value may have a relatively large value. As a result, as a program loop is repeated, the program pulse value may be quickly increased during the foggy programming operation, so that threshold voltages of memory cells which are not completely programmed may be quickly increased. In the foggy programming operation, although the threshold voltages of the memory cells are quickly increased, it may be difficult to finely control a width of a threshold voltage distribution. Therefore, during the foggy programming operation, the threshold voltage distribution of the memory cells may have a relatively large width, and during the fine programming operation, the width of the threshold voltage distribution of the memory cells may be finely controlled.

At step S420, the operation of verifying the first to third program states PV1 to PV3 using the foggy verify voltages may be performed. The foggy verify voltages may have smaller values than the target verify voltages of the first to third program states PV1 to PV3. The target verify voltages may be verify voltages used during the fine programming operation to be described below. The relationship between the foggy verify voltages and the target verify voltages will be described below in more detail with reference to FIGS. 17 and 18.

At step S430, whether the foggy programming operation has been completed may be determined by determining whether the verify operation performed based on the foggy verify voltages has passed. When the foggy programming operation is not completed, the process returns to step S410 and a next program loop progresses. As described above, the program pulse value may be increased using the step voltage having the relatively large value.

Steps S410, S420, and S430 indicate the program loop by the foggy programming operation. Program loops composed of steps S410, S420, and S430 are repeatedly performed until the verify operation based on the foggy verify voltages is completed.

In accordance with the method of operating the semiconductor memory device according to an embodiment of the present disclosure, the program operation on the flag cell FC may not be initiated before the foggy programming operation is completed. In other words, during the foggy programming operation, as described above in connection with step S410, the program prohibition voltage may be applied to the bit line coupled to the flag cell. Therefore, the threshold voltage of the flag cell does not change.

As a result of determination at step S430, if the foggy programming operation is completed, the fine programming operation may be initiated at steps 440, S450, and S460.

When the fine programming operation is initiated, step S440 of applying the program permission voltage to the bit line coupled to the flag cell FC and applying the program pulse to the selected word line, step S450 of performing the operation of verifying the first to third program states PV1 to PV3 by using the target verify voltages, and step S460 of determining whether the fine programming operation has been completed are performed.

As step S440 is performed, the program operation on the flag cell FC may be performed. At step S440, the program operation may be performed by applying the program permission voltage to the bit line coupled to the flag cell FC and applying the program pulse to the word lines coupled to the flag cell FC and the remaining cells. In other words, since the program permission voltage is applied to the bit line coupled to the flag cell FC, the threshold voltage of the flag cell FC may start to change when the program pulse is applied to the word line coupled to the flag cell FC.

Thereafter, at step S450, the operation of verifying the first to third program states PV1 to PV3 may be performed using the target verify voltages. The target verify voltages may be used in the fine programming operation. The target verify voltages may have relatively greater values than the foggy verify voltages used in the foggy programming operation.

At step S460, whether the fine programming operation has been completed may be determined by determining whether the verify operation performed based on the target verify voltages has passed. When the fine programming operation is not completed, the process returns to step S440 and a next program loop progresses.

The program pulse value may be increased as step S440 is repeated during the fine programming operation. During the fine programming operation, a step voltage for increasing the program pulse value may have a relatively small value. As the program loop is repeated, a width by which the threshold voltages of the memory cells are moved may be finely controlled during the fine programming operation. Therefore, a width of a threshold voltage distribution graph corresponding to the program states P1 to P3 may be narrowed.

In accordance with the method of operating the semiconductor memory device according to an embodiment of the present disclosure, when the fine programming operation is initiated, the program operation on the flag cell FC may be initiated. In other words, the flag cell FC may not be programmed during the foggy programming operation, and the flag cell FC may start to be programmed after the fine programming operation is initiated. Therefore, in accordance with the semiconductor memory device and the method of operating the semiconductor memory device according to an embodiment of the present disclosure, the operational reliability of the semiconductor memory device may be improved by initiating the program operation on the flag cell FC after the foggy programming operation is completed according to the foggy-fine programming scheme.

Figure 18:
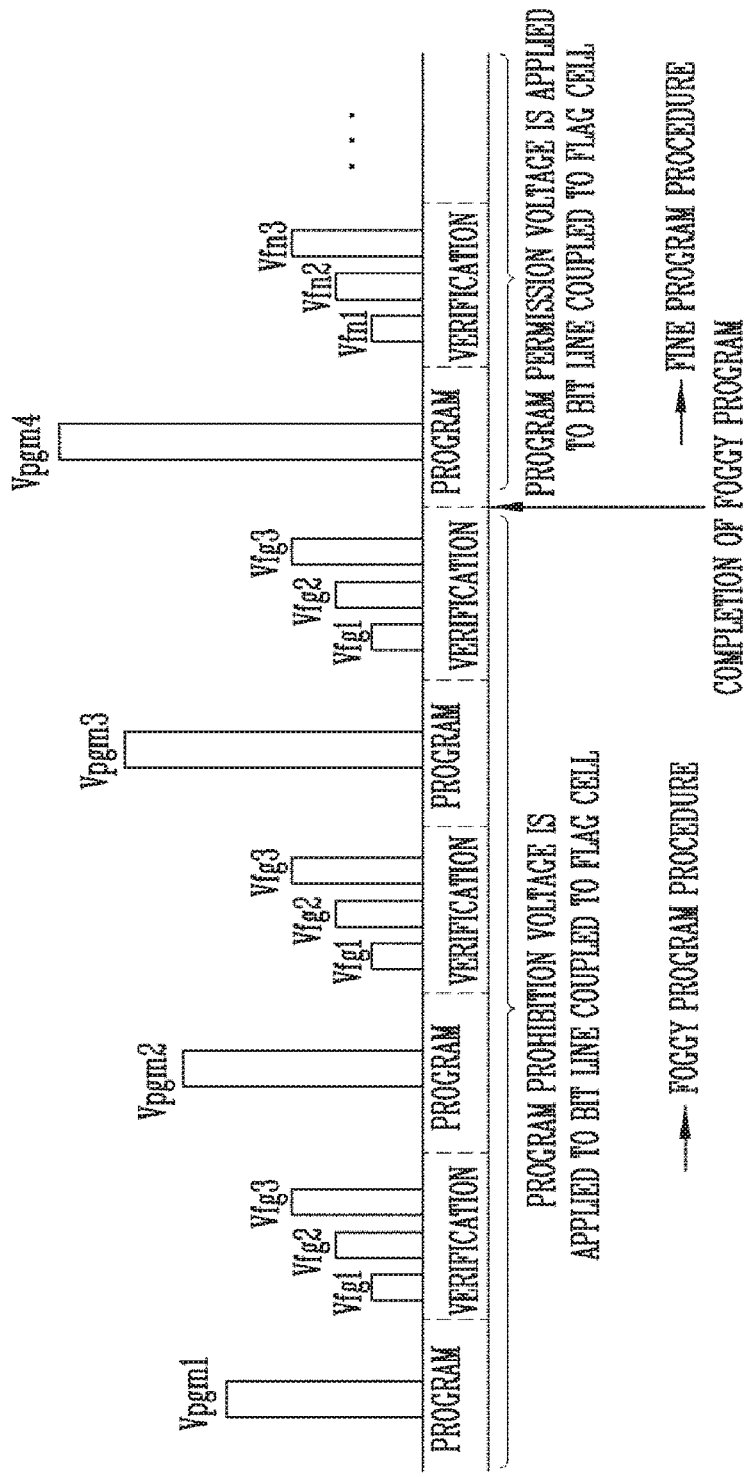
FIG. 18 is a diagram for explaining an MSB programming to operation for a page referred to by the description relating to FIG. 17.

FIG. 18 is a diagram for explaining the MSB programming operation for a page referred to by the description relating to FIG. 17.

Referring to FIG. 18, the method for the MSB programming operation of the page regarding FIG. 17 is described using pulses that are applied to word lines. In FIG. 18, a program loop composed of program and verification is repeatedly illustrated. Further, in FIG. 18, only a procedure of an MSB programming of a page is illustrated, and an illustration for the LSB programming for the page is omitted.

Referring to FIG. 18, as the procedure for the MSB programming of the page is initiated, a foggy programming operation may be initiated first. A first program loop may be executed by applying the first program pulse Vpgm1 and applying first to third foggy verify voltages Vfg1 to Vfg3. As a result of execution of the first program loop, if the verification using the first to third foggy verify voltages Vfg1 to Vfg3 does not pass, a second program loop may be executed. Accordingly, the second program voltage Vpgm2 and the first to third foggy verify voltages Vfg1 to Vfg3 are sequentially applied.

In this way, each program loop is executed until the verification using the first to third foggy verify voltages Vfg1 to Vfg3 is completed. During a foggy programming procedure, the program prohibition voltage is applied to the bit line coupled to the flag cell. Accordingly, even if the program pulse is applied to the word line coupled to the flag cell FC, the threshold voltage of the flag cell does not change. In FIG. 18, it can be seen that the foggy programming operation has been completed by a third program loop.

After the foggy programming procedure has been completed, a fine programming procedure may be initiated. A fourth program loop is executed by applying the fourth program pulse Vpgm4 and first to third fine verify voltages Vfn1 to Vfn3. The first to third fine verify voltages Vfn1 to Vfn3 may correspond to the target verify voltages described above with reference to FIG. 17. In FIG. 18, the term "fine verify voltage" which means a verify voltage used in the fine program procedure is used. Therefore, the term "fine verify voltage" may have substantially the same meaning as the "target verify voltage".

As illustrated in FIG. 18, the first foggy verify voltage Vfg1 may have a smaller voltage value than the first fine verify voltage Vfn1. In addition, the second foggy verify voltage Vfg2 may have a smaller voltage value than the second fine verify voltage Vfn2. The third foggy verify voltage Vfg3 may have a smaller voltage value than the third fine verify voltage Vfn3.

The program pulses Vpgm1, Vpgm2, and Vpgm3 applied to the foggy programming procedure may have a difference as large as a first step voltage value. In other words, the second program pulse Vpgm2 is greater than the first program pulse Vpgm1 by the first step voltage value, and the third program pulse Vpgm3 is greater than the second program pulse Vpgm2 by the first step voltage value.

The program pulses (Vpgm4, . . . ) applied in the fine program procedure may have a difference as large as a second step voltage. For example, though not shown in FIG. 18, a program pulse to be used in a fifth program loop may be greater than the fourth program pulse Vpgm4 by the second step voltage.

As described above, in the foggy-fine programming operation, the first step voltage value applied to the foggy programming procedure may be greater than the second step voltage applied to the fine program procedure. Therefore, in the foggy programming procedure, threshold voltage values of the memory cells are quickly increased. Accordingly, the entire program speed may be improved. On the other hand, in the foggy programming procedure, it may be difficult to finely control the threshold voltage values of the memory cells corresponding to each program state, and a threshold voltage distribution of the memory cells may be widened to adversely affect a read margin.

To prevent these adverse effects, the memory cells may be programmed by program pulses generated using a relatively small second step voltage in the fine programming operation, so that a width by which threshold voltages are moved may be finely controlled. Therefore, a width of a threshold voltage distribution of the memory cells may be narrowed.

In the fine program procedure, the program permission voltage is applied to the bit line coupled to the flag cell FC. Therefore, when the program pulse is applied to the word line coupled to the flag cell FC, a threshold voltage of the flag cell FC changes. Accordingly, a program operation on the flag cell FC may be initiated. As described above, in accordance with the semiconductor memory device and the operating method according to the embodiment of the present disclosure, by initiating the program operation on the flag cell FC after the foggy programming operation is completed, the operational reliability of the semiconductor memory device may be improved.

Figure 19:
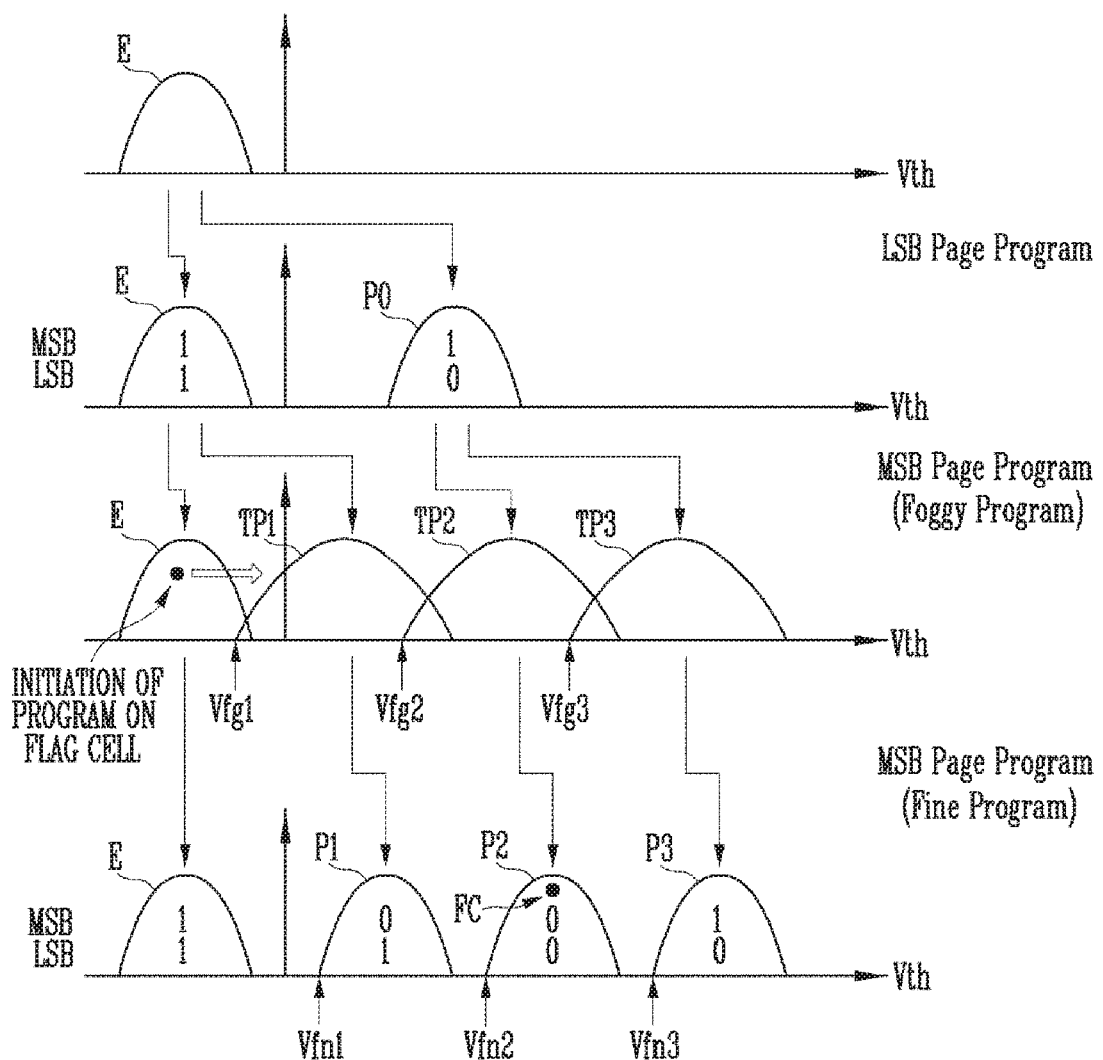
FIG. 19 is a diagram for explaining a program operation of a flag cell in a foggy-fine programming operation of FIG. 17.

FIG. 19 is a diagram illustrating a program operation on a flag cell in the foggy-fine programming operation of FIG. 17.

As illustrated in FIG. 19, prior to a program operation of a selected physical page, a distribution of threshold voltages of memory cells corresponding to a corresponding physical page corresponds to the erase state E. By performing the LSB programming operation of the page, memory cells having an LSB data of "0", among the memory cells having the erase state E, may be programmed. By the LSB programming operation, the memory cells may maintain the erase state E or the temporary program state P0. Though not shown in detail in FIG. 19, the foggy-fine programming scheme may also be applied even when the LSB programming operation of the page is performed.

An MSB programming operation is initiated after the LSB programming operation of the page is completed. In FIG. 19, the LSB programming operation of the page may be divided into the foggy programming operation and the fine programming operation.

First, a foggy programming operation of the MSB programming operation may be performed, so that memory cells having an MSB data of "1", among the memory cells having the erase state E, may be programmed to a first temporary program state TP1. Memory cells having the temporary program state P0 may be programmed to one of a second temporary program state TP2 and a third temporary program state TP3.

The foggy verify voltages Vfg1, Vfg2, and Vfg3 used in the foggy programming operation may have smaller values than the target verify voltages. In addition, a step voltage value for increasing a program pulse in the foggy programming operation may have a relatively large value. Therefore, as a result of performing the foggy programming operation, the first, second, and third temporary program states TP1, TP2, and TP3 may have a relatively wide threshold voltage distribution.

As shown in FIG. 19, the flag cell may not be programmed during the foggy programming operation. In accordance with the semiconductor memory device and the method of operating the same according to the present disclosure, the flag cell indicating whether MSB page data is programmed may start to be programmed after the completion of the foggy programming operation.

The fine programming operation may be initiated after the completion of the foggy programming operation. In the fine programming operation, the memory cells having the temporary program state TP1 may be programmed to the first program state P1, the memory cells having the second temporary program state TP2 may be programmed to the second program state P2, and the memory cells having the third temporary program state TP3 may be programmed to the third program state P3. During this procedure, the flag cell FC may also be programmed.

The first, second, and third fine verify voltages Vfn1, Vfn2, and Vfn3 used in the fine programming procedure may be target verify voltages for finally programming the memory cells to the first, second, and third program states P1, P2, and P3. As illustrated in FIG. 19, the first, second, and third fine verify voltages Vfn1, Vfn2, and Vfn3 may have greater values than the first, second, and third foggy verify voltages Vfg1, Vfg2, and Vfg3. In addition, as described above, the step voltage value for increasing the program pulse in the fine programming operation may have the relatively small value. Therefore, as a result of performing the fine programming operation, the first, second, and third program states P1, P2, and P3 may have a narrow threshold voltage distribution.

As described above with reference to FIGS. 16 to 18, in accordance with the semiconductor memory device and the method of operating the same according to an embodiment of the present disclosure, the program operation on the flag cell FC may be initiated after the foggy programming operation is completed according to the foggy-fine programming scheme. As a result, after a sufficiently large number of MSB programming loops have progressed, the program operation on the flag cell FC may be initiated. Accordingly, the operation reliability of the semiconductor memory device may be improved.

Figure 20:
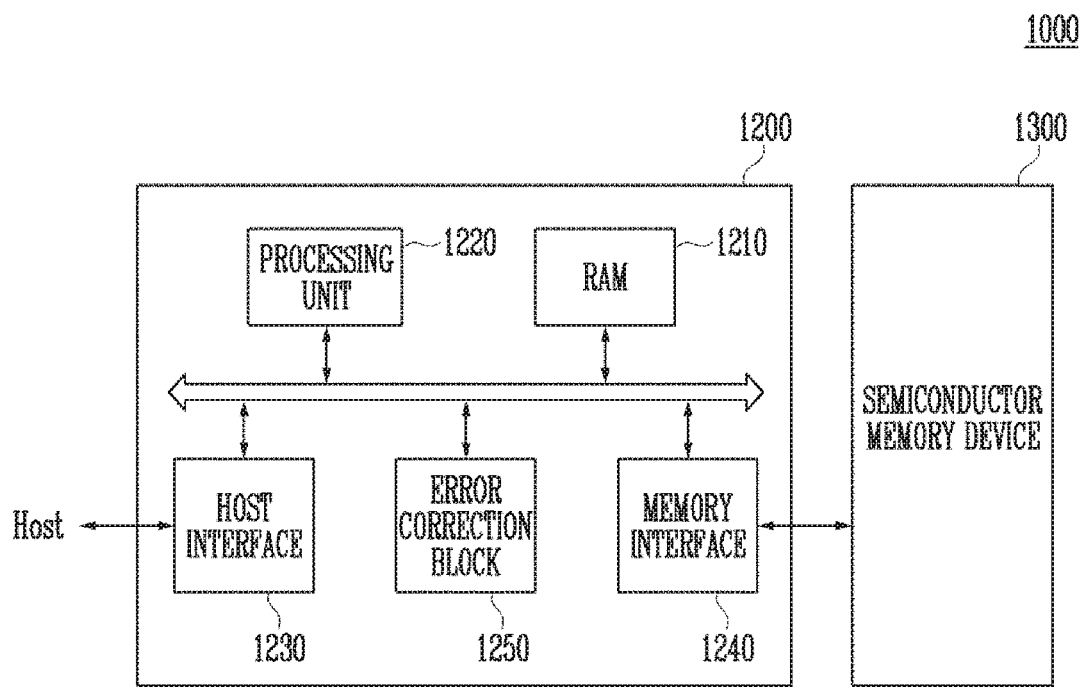
FIG. 20 is a block diagram illustrating a memory system 1000 including the semiconductor memory device of FIG. 1.

FIG. 20 is a block diagram illustrating a memory system 1000 including the semiconductor memory device 100 of FIG. 1.

Referring to FIG. 20, the memory system 1000 includes a semiconductor memory device 1300 and a controller 1200. The semiconductor memory device 1300 may be the semiconductor memory device described with reference to FIG. 1. Hereinafter, a repeated description thereof will be omitted.

The controller 1200 is coupled to a host Host and the semiconductor memory device 1300. The controller 1200 is configured to access the semiconductor memory device 1300 in response to a request from the host Host. For example, the controller 1200 is configured to control read, write, erase, and background operations of the semiconductor memory device 1300. The controller 1200 is configured to provide an interface between the host Host and the semiconductor memory device 1300. The controller 1200 is configured to run firmware for controlling the semiconductor memory device 1300.

The controller 1200 includes a RAM (Random Access Memory) 1210, a processing unit 1220, a host interface 1230, a memory interface 1240, and an error correction block 1250. The RAM 1210 is used as at least one of an operation memory of the processing unit 1220, a cache memory between the semiconductor memory device 1300 and the host Host, and a buffer memory between the semiconductor memory device 1300 and the host Host. The processing unit 1220 controls the overall operation of the controller 1200. Further, the controller 1200 may temporarily store program data provided from the host Host during a write operation.

The host interface 1230 includes a protocol for performing data exchange between the host Host and the controller 1200. In an example of an embodiment, the controller 1200 is configured to communicate with the host Host through at least one of various interface protocols such as a universal serial bus (USB) protocol, a multimedia card (MMC) protocol, a peripheral component interconnection (PCI) protocol, a PCI express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, and a private protocol.

The memory interface 1240 interfaces with the semiconductor memory device 1300. For example, the memory interface includes a NAND interface or NOR interface.

The error correction block 1250 uses an error correcting code (ECC) to detect and correct an error in data received from the semiconductor memory device 1300. The processing unit 1220 may adjust the read voltage based on the result of error detection by the error correction block 1250, and may control the semiconductor memory device 1300 to perform re-reading. In an example of an embodiment, the error correction block may be provided as an element of the controller 1200.

The controller 1200 and the semiconductor memory device 1300 may be integrated into a single semiconductor device. In an example of an embodiment, the controller 1200 and the semiconductor memory device 1300 may be integrated into a single semiconductor device to form a memory card. For example, the controller 1200 and the semiconductor memory device 1300 may be integrated into a single semiconductor device and form a memory card such as a personal computer memory card international association (PCMCIA), a compact flash card (CF), a smart media card (SM or SMC), a memory stick, a multimedia card (MMC, RS-MMC, or MMCmicro), a SD card (SD, miniSD, microSD, or SDHC), or a universal flash storage (UFS).

The controller 1200 and the semiconductor memory device 1300 may be integrated into a single semiconductor device to form a solid state drive (SSD). The SSD includes a storage device configured to store data in a semiconductor memory. When the memory system is used as the SSD, an operation speed of the host Host coupled to the memory system may be phenomenally improved.

In an embodiment, the memory system 1000 may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, or the like.

In an example of an embodiment, the semiconductor memory device 1300 or the memory system 1000 may be embedded in various types of packages. For example, the semiconductor memory device 1300 or the memory system 1000 may be embedded to be packaged in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline Integrated Circuit (SOIC), Shrink Small Outline Package (SSOP), Thin Small Outline Package (TSOP), Thin Quad Flatpack (TQFP), System In Package (SIP), Multi-Chip Package (MCP), Wafer-level Fabricated Package (WFP), or Wafer-Level Processed Stack Package (WSP).

Figure 21:
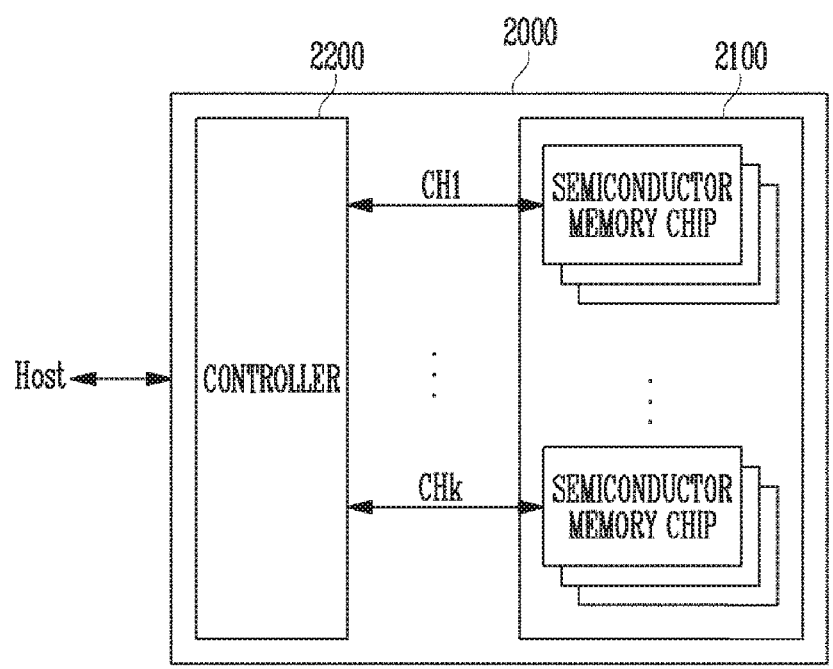
FIG. 21 is a block diagram illustrating an example of application of the memory system of FIG. 20.

FIG. 21 is a block diagram illustrating an example of application of the memory system of FIG. 20.

Referring to FIG. 21, a memory system 2000 includes a semiconductor memory device 2100 and a controller 2200. The semiconductor memory device 2100 includes a plurality of semiconductor memory chips. The semiconductor memory chips are divided into a plurality of groups.

In FIG. 21, it is illustrated that each of the plurality of groups communicates with the controller 2200 through first to k-th channels CH1 to CHk. Each semiconductor memory chip may have the same configuration and operation as those of the semiconductor memory device 100 described with reference to FIG. 1.

Each group communicates with the controller 2200 through one common channel. The controller 2200 has the same configuration as that of the controller 1200 described with reference to FIG. 20 and is configured to control the plurality of memory chips of the semiconductor memory device 2100 through the plurality of channels CH1 to CHk.

Figure 22:
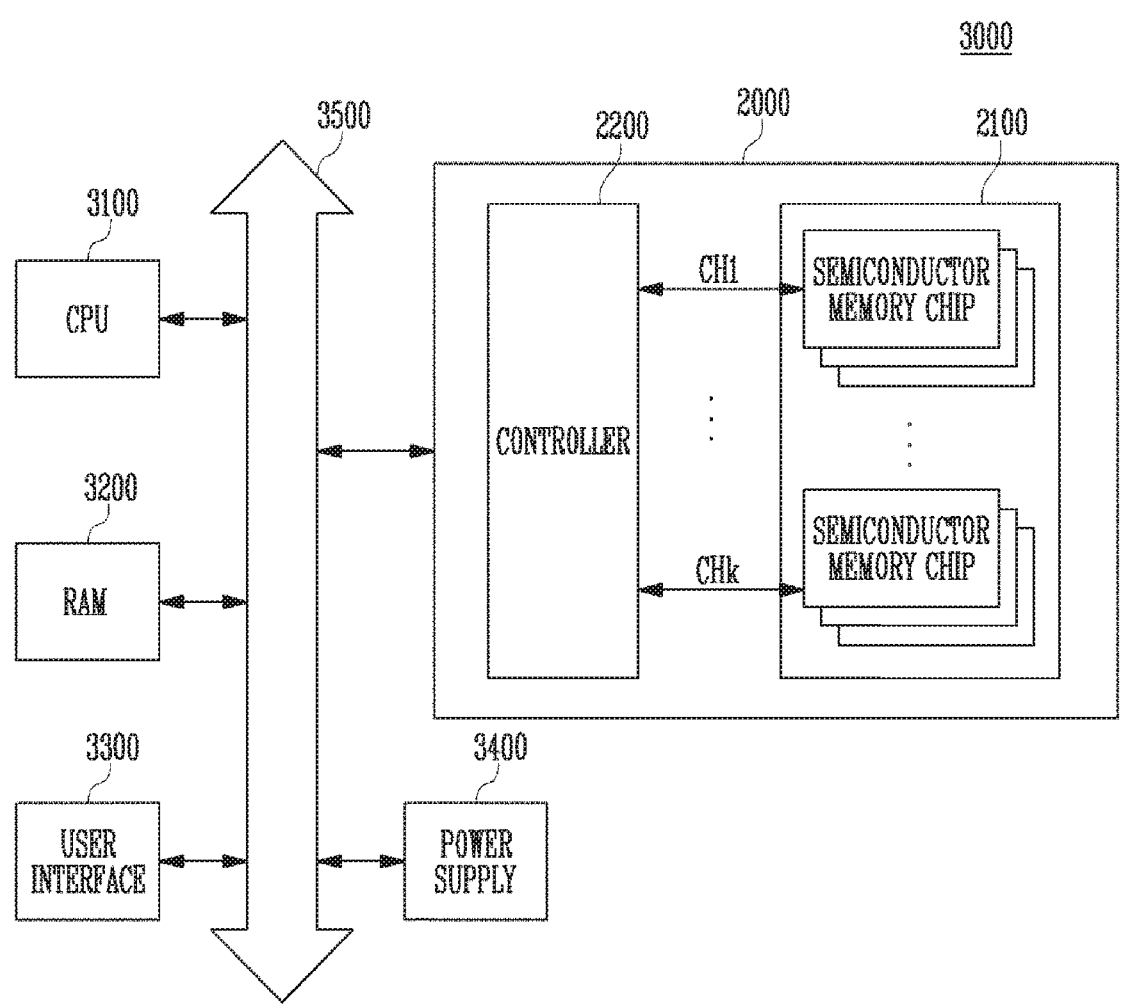
FIG. 22 is a block diagram illustrating a computing system including the memory system described with reference to FIG. 21.

FIG. 22 is a block diagram illustrating a computing system including the memory system described with reference to FIG. 21.

A computing system 3000 may include a central processing unit (CPU) 3100, a RAM 3200, a user interface 3300, a power supply 3400, a system bus 3500, and the memory system 2000.

The memory system 2000 is electrically coupled to the CPU 3100, the RAM 3200, the user interface 3300, and the power supply 3400 through the system bus 3500. Data provided through the user interface 3300 or processed by the CPU 3100 is stored in the memory system 2000.

In FIG. 22, the semiconductor memory device 2100 is illustrated as being coupled to the system bus 3500 through the controller 2200. However, the semiconductor memory device 2100 may be directly coupled to the system bus 3500. The function of the controller 2200 may be performed by the CPU 3100 and the RAM 3200.

In FIG. 22, the memory system 2000 described with reference to FIG. 21 is illustrated as being provided. However, the memory system 2000 may be replaced with the memory system 1000 described with reference to FIG. 20. In an embodiment, the computing system 3000 may be configured to include all of the memory systems 1000 and 2000 described with reference to FIGS. 19 and 20.

In accordance with an embodiment of the present disclosure, there may be provided a semiconductor memory device, which may have improved operation reliability In accordance with an embodiment of the present disclosure, there may be provided a method of operating a semiconductor memory device, which may improve reliability.

Furthermore, the embodiments disclosed in the present specification and the drawings aims to help those with ordinary knowledge in this art more clearly understand the present disclosure rather than aiming to limit the bounds of the present disclosure. Therefore, one of ordinary skill in the art to which the present disclosure belongs will be able to easily understand that various modifications are possible based on the technical scope of the present disclosure.

What is claimed is:

1. A method of operating a semiconductor memory device, comprising:
   programming selected memory cells with first page data; and
   programming the selected memory cells with second page data and programming a flag cell with flag data according to a foggy-fine programming scheme,
   wherein the flag data indicates whether data programmed according to the program operation is the first page data or the second page data,
   wherein an operation of programming the flag cell with the flag data is initiated after foggy programming of the second page data is completed and during fine programming of the second page data, and
   wherein the programming of the selected memory cells with the second page data and the programming of the flag cell with the flag data according to the foggy-fine programming scheme comprise:
   a foggy programming operation of programming memory cells except the flag cell with the second page data by using first verify voltages; and
   a fine programming operation of programming the memory cells including the flag cell with the second page data by using second verify voltages, and
   wherein each of the second verify voltages is greater than a corresponding one of the first verify voltages.

2. The method according to claim 1, wherein in the foggy programming operation, program pulses are generated using a first step voltage, and in the fine programming operation, program pulses are generated using a second step voltage smaller than the first step voltage.

3. The method according to claim 2, wherein in the foggy programming operation, a program prohibition voltage is applied to a bit line coupled to the flag cell.

4. The method according to claim 1, wherein in the fine programming operation, a program permission voltage is applied to a bit line coupled to the flag cell.

5. A semiconductor memory device, comprising:
   a memory cell array including a plurality of memory cells;
   a peripheral circuit configured to perform a program operation of programming data in memory cells coupled to a selected word line, among the plurality of memory cells; and
   a control logic configured to control the peripheral circuit such that, during the program operation, a first program loop for storing first page data and a second program loop for storing second page data according to a foggy-fine programming scheme,
   wherein the control logic is configured to control the peripheral circuit such that, during execution of the second program loop, flag data is programmed in a flag cell, among memory cells coupled to the selected word line, after a foggy programming of the second page data is completed and during a fine programming of the second page data, and
   wherein during the execution of the second program loop, the control logic is configured to:
   perform a foggy programming of memory cells except for the flag cell with the second page data by using first verify voltages; and
   perform a fine programming of the memory cells including the flag cell with the second page data by using second verify voltages, and
   wherein each of the second verify voltages is greater than a corresponding one of the first verify voltages.

6. The semiconductor memory device according to claim 5, wherein during the foggy programming of the memory cells except for the flag cell, the control logic is configured to control the peripheral circuit to apply a program prohibition voltage to a bit line coupled to the flag cell.

7. The semiconductor memory device according to claim 6, wherein during the fine programming of the memory cells including the flag cell, the control logic is configured to control the peripheral circuit to apply a program permission voltage to a bit line coupled to the flag cell.

8. The semiconductor memory device according to claim 5, wherein the flag data indicates that data programmed according to the program operation is the second page data.

* * * * *